US008598538B2

(12) United States Patent
Aoki

(10) Patent No.: US 8,598,538 B2
(45) Date of Patent: Dec. 3, 2013

(54) MOVABLE BODY APPARATUS, OBJECT PROCESSING DEVICE, EXPOSURE APPARATUS, FLAT-PANEL DISPLAY MANUFACTURING METHOD, AND DEVICE MANUFACTURING METHOD

(75) Inventor: Yasuo Aoki, Zushi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 13/221,420

(22) Filed: Aug. 30, 2011

(65) Prior Publication Data
US 2012/0056105 A1 Mar. 8, 2012

Related U.S. Application Data

(60) Provisional application No. 61/380,454, filed on Sep. 7, 2010.

(51) Int. Cl.
G01N 21/00 (2006.01)
G21K 5/10 (2006.01)
H02K 41/02 (2006.01)

(52) U.S. Cl.
USPC ............. 250/442.11; 250/491.1; 310/12.05

(58) Field of Classification Search
USPC ............. 250/442.11, 491.1, 492.2, 492.21, 250/492.3, 526; 310/12.01, 12.05, 12.06, 310/12.27, 12.31
See application file for complete search history.

(56) References Cited

U.S. PATENT DOCUMENTS

| 4,528,451 | A | * | 7/1985 | Petric et al. ............. 250/441.11 |
| 5,448,332 | A | | 9/1995 | Sakakibara et al. |
| 6,040,096 | A | | 3/2000 | Kakizaki et al. |
| 6,333,572 | B1 | * | 12/2001 | Ono ............................. 310/12.06 |
| 6,445,440 | B1 | * | 9/2002 | Bisschops et al. ............... 355/53 |
| 6,552,775 | B1 | | 4/2003 | Yanagihara et al. |
| 6,559,928 | B1 | * | 5/2003 | Aoki ............................... 355/72 |
| 6,778,257 | B2 | | 8/2004 | Bleeker et al. |
| 6,810,297 | B2 | | 10/2004 | Adin et al. |
| 7,483,119 | B2 | * | 1/2009 | Owa et al. ........................ 355/53 |
| 7,530,778 | B2 | | 5/2009 | Yassour et al. |

(Continued)

FOREIGN PATENT DOCUMENTS

EP   1 052 550 A2   11/2000
EP   1 811 526 A1   7/2007

(Continued)

OTHER PUBLICATIONS

Feb. 7, 2012 International Search Report and Written Opinion issued in International Application No. PCT/JP2011/070664.

(Continued)

Primary Examiner — Bernard E Souw
(74) Attorney, Agent, or Firm — Oliff & Berridge, PLC

(57) ABSTRACT

In a substrate stage device, a substrate is held by a substrate support member mounted on a Y step surface plate. The substrate support member moves in the scanning direction in long strokes on the Y step surface plate. The part corresponding to an exposure area of the substrate is held by suction in a non-contact manner from below by a fixed point stage, and other parts are supported by levitation by the plurality of air floating devices placed on the Y step surface plate. The part corresponding to the exposure area of the substrate is controlled so that surface position of the substrate is located in the depth of focus of the projection optical system by the fixed point stage.

41 Claims, 13 Drawing Sheets

(56) References Cited

U.S. PATENT DOCUMENTS

| | | | |
|---|---|---|---|
| 7,607,647 | B2 | 10/2009 | Zhao et al. |
| 2003/0098964 | A1 | 5/2003 | Lee et al. |
| 2003/0098965 | A1 | 5/2003 | Binnard et al. |
| 2005/0040338 | A1* | 2/2005 | Weiss et al. ............... 250/358.1 |
| 2006/0096395 | A1 | 5/2006 | Weiss et al. |
| 2006/0098176 | A1* | 5/2006 | Gui et al. ..................... 355/53 |
| 2006/0284434 | A1 | 12/2006 | Yang |
| 2007/0017442 | A1 | 1/2007 | Yamasaki et al. |
| 2007/0195653 | A1* | 8/2007 | Yassour et al. ............ 369/13.24 |
| 2007/0296936 | A1 | 12/2007 | Kato et al. |
| 2008/0013060 | A1 | 1/2008 | Ichinose et al. |
| 2008/0014075 | A1 | 1/2008 | Pun et al. |
| 2008/0030702 | A1 | 2/2008 | Kawamura |
| 2008/0088843 | A1 | 4/2008 | Shibazaki |
| 2008/0229811 | A1 | 9/2008 | Zhao et al. |
| 2010/0018950 | A1 | 1/2010 | Aoki et al. |
| 2010/0065853 | A1* | 3/2010 | Im ................................ 257/75 |
| 2010/0266961 | A1* | 10/2010 | Kawamura et al. .......... 430/319 |
| 2011/0042874 | A1 | 2/2011 | Aoki et al. |
| 2011/0043784 | A1 | 2/2011 | Aoki et al. |
| 2011/0053092 | A1 | 3/2011 | Aoki |
| 2011/0174991 | A1* | 7/2011 | Hui et al. .................. 250/491.1 |
| 2012/0057140 | A1 | 3/2012 | Aoki |
| 2012/0064460 | A1* | 3/2012 | Aoki ............................ 430/320 |
| 2012/0064461 | A1* | 3/2012 | Aoki ............................ 430/320 |

FOREIGN PATENT DOCUMENTS

| | | |
|---|---|---|
| JP | A-2004-238133 | 8/2004 |
| JP | A-2006-086442 | 3/2006 |
| JP | A-2009-271340 | 11/2009 |
| JP | A-2010-054849 | 3/2010 |
| WO | WO 2008/121561 A1 | 10/2008 |
| WO | WO 2008/129762 A1 | 10/2008 |

OTHER PUBLICATIONS

Feb. 3, 2012 International Search Report and Written Opinion issued in International Application No. PCT/JP2011/070666.

Feb. 3, 2012 International Search Report and Written Opinion issued in International Application No. PCT/JP2011/070667.

Feb. 6, 2012 International Search Report and Written Opinion issued in international Application No. PCT/JP2011/071171.

Dec. 6, 2010 International Search Report and Written Opinion issued in International Application No. PCT/JP2010/064131.

Dec. 6, 2010 International Search Report and Written Opinion issued in International Application No. PCT/JP2010/064134.

Dec. 6, 2010 International Search Report issued and Written Opinion in International Application No. PCT/JP2010/064430.

Apr. 17, 2012 Office Action issued in U.S. Appl. No. 12/855,181.

Nov. 23, 2012 Office Action issued in U.S. Appl. No. 12/859,484.

Jan. 3, 2013 Office Action issued in U.S. Appl. No. 12/855,181.

Jun. 27, 2013 Office Action issued in U.S. Appl. No. 12/855,283.

Jul. 17, 2013 Office Action issued in U.S. Appl. No. 12/859,484.

* cited by examiner

MOVABLE BODY APPARATUS, OBJECT PROCESSING DEVICE, EXPOSURE APPARATUS, FLAT-PANEL DISPLAY MANUFACTURING METHOD, AND DEVICE MANUFACTURING METHOD

CROSS-REFERENCE TO RELATED APPLICATIONS

This non-provisional application claims the benefit of Provisional Application No. 61/380,454 filed Sep. 7, 2010, the disclosure of which is hereby incorporated herein by reference in its entirety.

BACKGROUND OF THE INVENTION

1. Field of the Invention

The present invention relates to movable body apparatuses, object processing devices, exposure apparatuses, flat-panel display manufacturing methods, and device manufacturing methods, and more particularly to a movable body apparatus which moves an object along a predetermined two-dimensional plane, an object processing device which performs a predetermined processing on an object held by the movable body apparatus, an exposure apparatus which forms a predetermined pattern on an object held by the movable body apparatus, a flat-panel display manufacturing method which uses the exposure apparatus, and a device manufacturing method which uses the exposure apparatus.

2. Description of the Background Art

Conventionally, in a lithography process for manufacturing electron devices (microdevices) such as liquid crystal display devices and semiconductor devices (such as integrated circuits), exposure apparatuses such as a projection exposure apparatus by a step-and-repeat method (a so-called stepper), or a projection exposure apparatus by a step-and-scan method (a so-called scanning stepper (which is also called a scanner) is mainly used.

In this type of exposure apparatus, the object (a glass plate, or a wafer (hereinafter, generally referred to as a "substrate")) subject to exposure is mounted on a substrate stage device. And a circuit pattern formed on a mask (or a reticle) is transferred onto a substrate by irradiation of an exposure light via an optical system such as a projection lens. (e.g., refer to Patent Application Publication No. 2010/0018950).

Now, in recent years, substrates subject to exposure of exposure apparatuses, especially rectangular shaped glass plates used for liquid crystal displays, tend to increase in size such as, for example, one side being 3 meters or more, which causes the size of the substrate stage device to increase, as well as the weight. Therefore, development of a compact lightweight stage device that can control the position of an exposure object (substrate) at a high speed with high precision was desired.

SUMMARY OF THE INVENTION

According to a first aspect of the present invention, there is provided a first movable body apparatus, comprising: a first movable body which holds an edge of an object placed along a predetermined two-dimensional plane that is parallel to a horizontal plane, and is movable with predetermined strokes at least in a first direction within the two-dimensional plane; and a second movable body which includes an object support member that supports the object from below within a movable range in the first direction of the first movable body, and is movable in a second direction parallel to a second axis orthogonal to the first direction within the two-dimensional plane along with the first movable body.

According to this apparatus, by the first movable body moving in predetermined strokes in a direction parallel to the first axis, an object held by the first movable body moves in predetermined strokes in a first direction in a state where the object is supported from below. Further, because the second movable body having an object support member moves in a second direction along with the first movable body, the object can be driven arbitrarily in the first direction and/or in the second direction. Because the object is constantly supported from below by the object support member within the movable range of the object, bending due to its self-weight can be suppressed. Accordingly, the weight and the size of the apparatus can be reduced when compared with the case when the object is mounted on a holding member having an area about the same as the object and driving the holding member.

According to a second aspect of the present invention, there is provided an object processing device, comprising: the movable body apparatus of the present invention; and an execution device which executes a predetermined operation to the object to a part held by the holding device from a side opposite to the holding device to perform a predetermined processing on the object.

According to a third aspect of the present invention, there is provided an exposure apparatus, the apparatus comprising: the movable body apparatus of the present invention; and a pattern formation device which exposes the object with an energy beam and forms a predetermined pattern on the object.

According to a fourth aspect of the present invention, there is provided a flat-panel display manufacturing method, comprising: exposing the substrate using the exposure apparatus of the present invention; and developing the substrate that has been exposed.

According to a fifth aspect of the present invention, there is provided a device manufacturing method, comprising: exposing an object using the exposure apparatus of the present invention; and developing the object that has been exposed.

According to a sixth aspect of the present invention, there is provided a second exposure apparatus that exposes an object with an energy beam and forms a pattern on the object, the apparatus comprising: a first movable body which holds an edge of the object placed along a predetermined two-dimensional plane that is parallel to a horizontal plane, and is movable with predetermined strokes at least in a first direction within the two-dimensional plane; a second movable body which includes an object support member that supports the object from below within a movable range in the first direction of the first movable body, and is movable in a second direction orthogonal to the first direction within the two-dimensional plane along with the first movable body; and an exposure system which exposes the object with the energy beam.

According to a seventh aspect of the present invention, there is provided a flat-panel display manufacturing method, comprising: exposing the substrate using the second exposure apparatus described above; and developing the substrate that has been exposed.

According to an eighth aspect of the present invention, there is provided a device manufacturing method, comprising: exposing the object using the second exposure apparatus described above; and developing the object that has been exposed.

BRIEF DESCRIPTION OF THE DRAWINGS

In the accompanying drawings.

DESCRIPTION OF THE EMBODIMENTS

First Embodiment

A first embodiment will be described below, with reference to FIGS. 1 to 8B.

Figure 1:
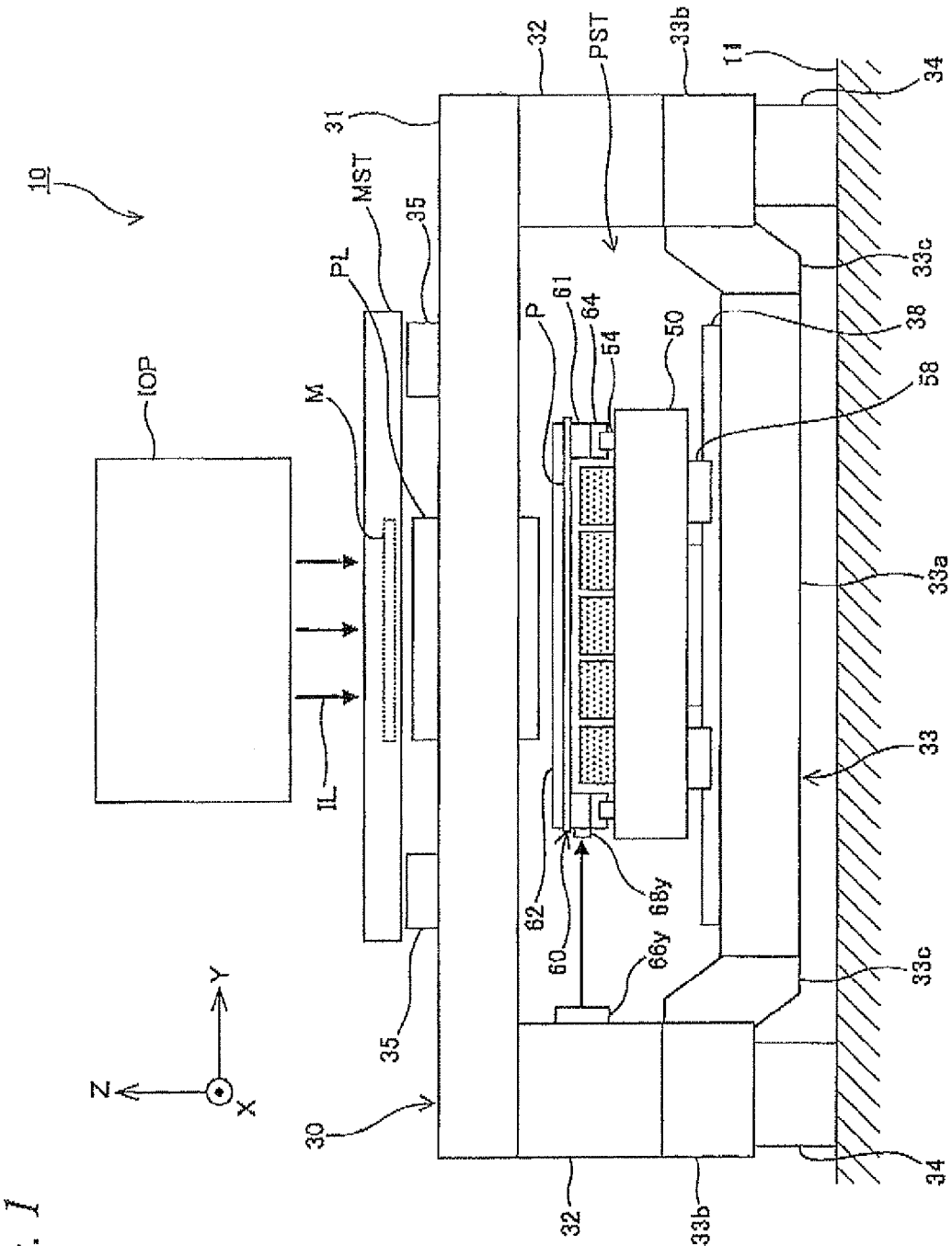
FIG. 1 is a view that schematically shows a configuration of a liquid crystal exposure apparatus of a first embodiment.

FIG. 1 schematically shows a configuration of an exposure apparatus 10 related to the first embodiment. Liquid crystal exposure apparatus 10 is a projection exposure apparatus by a step-and-scan method, or a so-called scanner in which a rectangular glass substrate P (hereinafter, simply referred to as a substrate P) that is used in a liquid crystal display device (flat panel display) serves as an exposure subject.

As shown in FIG. 1, liquid crystal exposure apparatus is equipped with an illumination system OP, a mask stage MST holding a mask M, a projection optical system PL, a device main section 30 supporting mask stage MST, projection optical system PL and the like, a substrate stage device PST holding substrate P, and a control system and the like thereof. In the description below, the explanation is given assuming that a direction in which mask M and substrate P are scanned relative to projection optical system PL, respectively, during exposure is an X-axis direction, a direction orthogonal to the X-axis direction within a horizontal plane is a Y-axis direction, and a direction orthogonal to the X-axis and Y-axis directions is a Z-axis direction, and rotational (tilt) directions around the X-axis, Y-axis and Z-axis are θx, θy and θz directions, respectively. Further, positions in the X-axis, the Y-axis, and the Z-axis directions will each be described as X position, Y position, and Z position.

Illumination system IOP is configured similar to the illumination system that is disclosed in, for example, U.S. Pat. No. 6,552,775 and the like. More specifically, illumination system IOP irradiates mask M with a light emitted from a light source that is not illustrated (e.g. a mercury lamp), as an illumination light for exposure (illumination light) IL, via a reflection mirror, a dichroic mirror, a shutter, a wavelength selecting filter, various types of lenses and the like, which are not illustrated. As illumination light IL, for example, a light such as an i-line (with a wavelength of 365 nm), a g-line (with a wavelength of 436 nm) or an h-line (with a wavelength of 405 nm) (or a synthetic light of the i-line, the g-line and the h-line described above) is used. Further, the wavelength of illumination light IL can be appropriately switched by the wavelength selecting filter, for example, according to the required resolution.

On mask stage MST, mask M having a pattern surface (the lower surface in FIG. 1) on which a circuit pattern and the like are formed is fixed by, for example, vacuum suction. Mask stage MST is mounted in a non-contact manner on a pair of mask stage guides 35 fixed on a barrel surface plate 31 which is a part of device main section 30, and is driven, for example, by a mask stage drive system (not illustrated) including a linear motor in a scanning direction (the X-axis direction) with predetermined strokes, and is also finely driven appropriately in the Y-axis direction, and the θz direction.

Positional information (including rotation information in the θz direction) in the XY plane of mask stage MST is measured by a mask interferometer system that includes a laser interferometer which is not illustrated.

Projection optical system PL is supported below mask stage MST in FIG. 1, by a barrel surface plate 31. Projection optical system PL of the embodiment has a configuration similar to the projection optical system disclosed in, for example, U.S. Pat. No. 6,552,775. More specifically, projection optical system PL includes a plurality of projection optical systems (multi-lens projection optical systems) whose projection areas, where a pattern image of mask M is projected, are placed in a zigzag shape, and functions equivalently to a projection optical system that has a single image field with a rectangular shape whose longitudinal direction is in the Y-axis direction. In the embodiment, as each of the plurality of projection optical systems, for example, a projection optical system that is a both-side telecentric equal-magnification system that forms an erected normal image is used. In the description below, the plurality of projection areas placed in a zigzag shape of projection optical system PL are referred to as an exposure area IA (refer to FIG. 2) as a whole.

Therefore, when an illumination area on mask M is illuminated with illumination light IL from illumination system IOP, by illumination light IL that has passed through mask M, a projected image (partial erected image) of a circuit pattern of mask M within the illumination area is formed, via projection optical system PL, on an irradiation area (exposure area IA) of illumination light IL, which is conjugate to the illumination area, on substrate P whose surface is coated with a resist (sensitive agent). Then, by moving mask M relative to the illumination area (illumination light IL) in the scanning direction (X-axis direction) and also moving substrate P relative to exposure area IA (illumination light IL) in the scanning direction (X-axis direction) by a synchronous drive of mask stage MST and substrate stage PST, scanning exposure of one shot area (divided area) on substrate P is performed, and a pattern of mask M (mask pattern) is transferred onto the shot area. More specifically, in the embodiment, a pattern of mask M is generated on substrate P by illumination system IOP and projection optical system PL, and the pattern is formed on substrate P by exposure of a sensitive layer (resist layer) on substrate P with illumination light IL.

Device main section 30 includes barrel platform 31 previously described, a pair of side columns 32 that support each of the vicinity of the ends of barrel platform 31 on the +Y side and the −Y side from below, and a substrate stage mounting 33 that support each of the pair of side columns 32 from below. Substrate stage mounting 33 includes a main section 33a consisting of a plate shaped member (refer to FIG. 2) having a rectangular shape in a planar view whose longitudinal direction is in the X-axis direction, a pair of support sections 33b that each support the pair of side columns 32, and a pair of connections 33c that connect the pair of supporting sections 33b and main section 33a. Main section 33a, the pair of support sections 33b, and the pair of connections 33c are integrally formed. Each of the pair of support sections 33b are supported from below on a vibration isolator 34 installed on floor 11 of the clean room. This vibrationally separates mask stage MST described above supported by device main section 30 and projection optical system PL with respect to floor 11.

Figure 2:
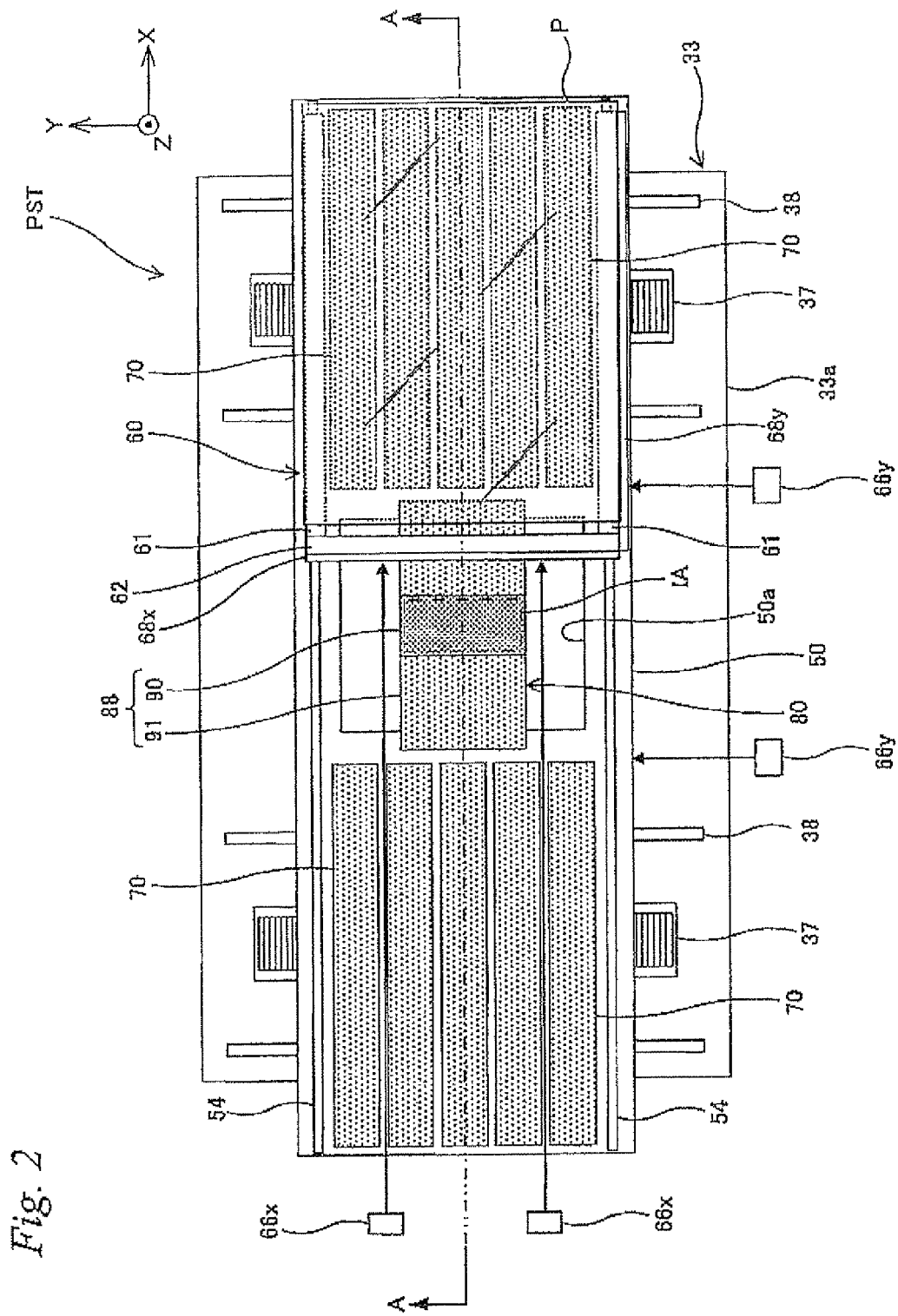
FIG. 2 is a plan view of a substrate stage device which the liquid crystal exposure apparatus of FIG. 1 has.

To the upper surface of main section 33a, as shown in FIG. 2, a pair of Y stators 37 is fixed. The pair of Y stators 37 consist of members extending parallel to the Y-axis, and is placed parallel to each other at a predetermined distance in the X-axis direction. Each of the pair of Y stators 73 have a magnet unit including a plurality of permanent magnets arranged in the Y-axis direction. Further, on the upper surface of main section 33a, to the +X side and −X side of Y stator 37 which is on the +X side, Y linear guide members 38 that each extend parallel to the Y-axis are fixed parallel to each other. Further, on the upper surface of main section 33a, also to the +X side and −X side of Y stator 37 which is on the −X side, Y linear guide members 38 that each extend parallel to the Y-axis are fixed parallel to each other. Incidentally, in FIG. 2 (and FIGS. 5A to 8B), of substrate stage mounting 33, illustration of the pair of support sections 33b and the pair of connections 33c (each refer to FIG. 1) is omitted.

As shown in FIG. 2, substrate stage device PST is equipped with a Y step surface plate 50, a substrate support member 60, a plurality of air floating devices 70, a fixed point stage 80 and the like.

Y step surface plate 50 consists of a plate shaped member which is parallel to the XY plane with a rectangular shape in a planar view and whose longitudinal direction is in the X-axis direction, and is placed above main section 33a. The dimension in the width (dimension (length) in the Y-axis direction) of Y step surface plate 50 is set at the same level as (actually slightly longer than) the dimension in the width (dimension (length) in the Y-axis direction) of substrate P. Further, the dimension (length) in the longitudinal direction of Y step surface plate 50 is set to a dimension (length) that covers the movement range of substrate P in the X-axis direction, and in the present embodiment, for example, is set to around 2.5 times the dimension of substrate P in the X-axis direction. As it can be seen from FIGS. 2 and 3, in the center of Y step surface plate 50, an elongated slot shaped opening section 50a is formed elongated in the Y-axis direction.

Figure 3:
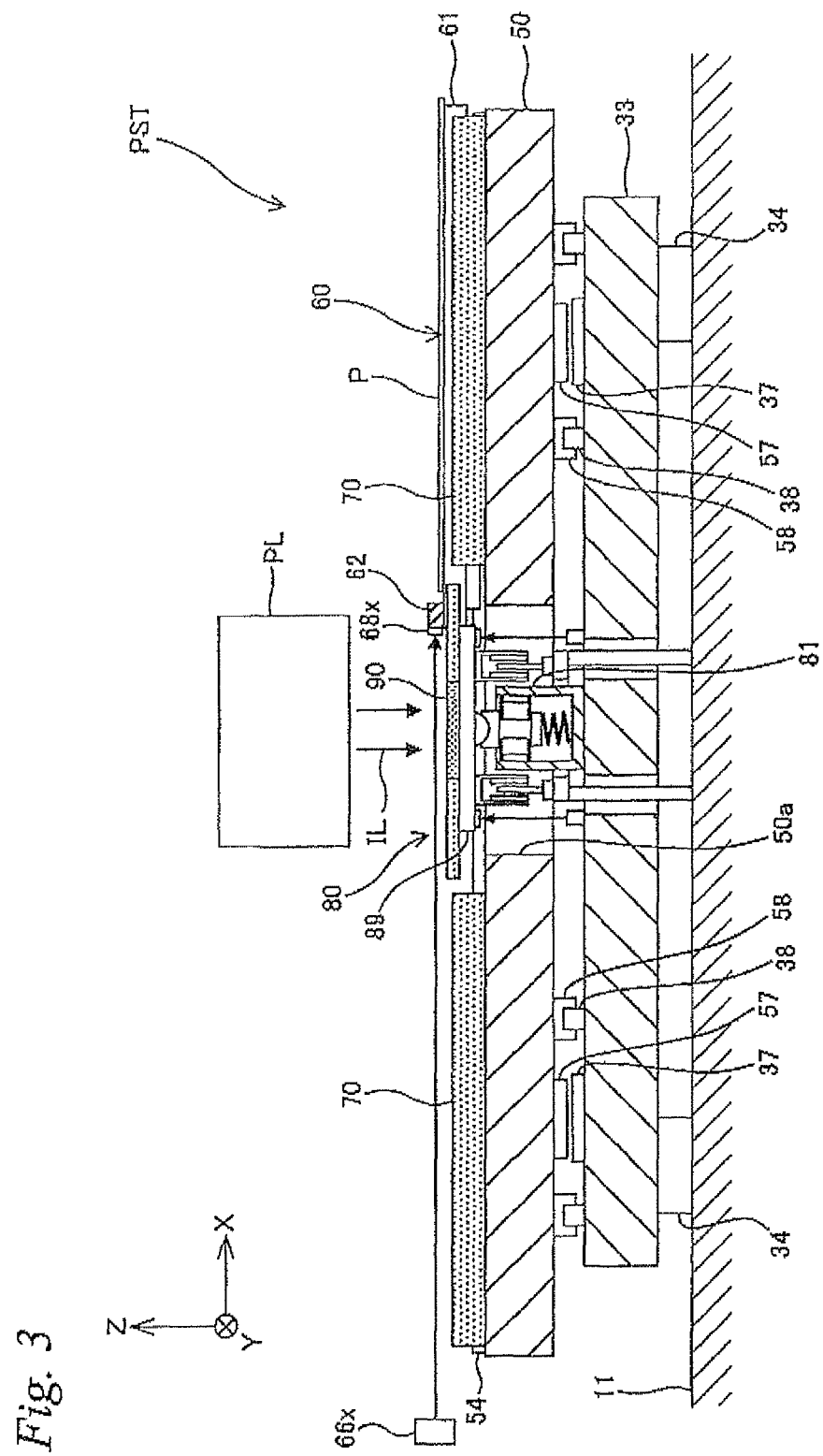
FIG. 3 is a sectional view of line A-A in FIG. 2.

To the lower surface of Y step surface plate 50, a pair of Y movers 57 each facing a pair of Y stators 37 are fixed, as shown in FIG. 3. Each Y mover 57 has a coil unit including a coil which is not illustrated. Y step surface plate 50 is driven in predetermined strokes in the Y-axis direction on substrate stage mounting 33, for example, by two (a pair of) Y linear motors consisting of a pair of Y stators 37 and a pair of Y movers 57.

Further, on the lower surface of Y step surface plate 50, a plurality of Y sliders 58 is fixed. Y slider 58 consists of a member whose XZ section is an inverted U-shape, and engages slidable with low friction with Y linear guide members 38. As shown in FIG. 1, for example, two Y sliders 58 are provided to one Y linear guide member 38. Accordingly, in the present embodiment, for example, a total of eight Y sliders 58 are fixed (In FIG. 3, of the eight Y sliders 58, four sliders are hidden in the depth of the other four) to the lower surface of Y step surface plate 50, corresponding, for example, to four Y linear guide members 38.

Referring back to FIG. 2, in the vicinity of an edge on the +Y side and an edge on the −Y side on the upper surface of Y step surface plate 50, X linear guides 54 that each extend parallel to the X-axis are fixed parallel to each other.

Substrate support member 60 consists of a member having a U-shaped in a planar view as shown in FIG. 2, and supports substrate P from below. Substrate support member 60 includes a pair of support members 61, and a pair of interlinking members 62 which connect the pair of X support members 61.

The pair of X support members 61 each consist of a bar-shaped member whose YZ sectional shape is rectangular (refer to FIG. 1) and longitudinal direction is in the X-axis direction, and the members are placed parallel to each other at a predetermined distance (a distance somewhat shorter than the dimension of substrate P in the Y-axis direction) in the Y-axis direction. The dimension in the longitudinal direction of each of the pair of X support members 61 is set slightly longer than the dimension of substrate P in the X-axis direction. Substrate P is supported from below by the pair of X support members 61, close to the edge on the +Y side and the −Y side.

The pair of X support members 61 each have an adsorption pad which is not illustrated on its upper surface. The pair of X support members 61 suction and hold the vicinity of both ends in the Y-axis direction of substrate P from below, for example, by vacuum chucking. To the side surface on the −Y side of support member 61 which is on the −Y side, a Y movable mirror 68y (a bar mirror) having a reflection surface orthogonal to the Y-axis is attached.

As shown in FIG. 1, the distance between the pair of X support members 61 in the Y-axis direction corresponds to the pair of X linear guides 54. To the lower surface of each of the pair of X support members 61, an X slider 64 is fixed consisting of a member whose YZ section is an inverted U-shape, and engages slidable with low friction with the corresponding X linear guide 54. Incidentally, although it is not illustrated in FIG. 1 because the sliders overlap in the depth of the page surface, for example, two X sliders 64 are provided with respect to X linear guide 54.

Interlinking member 62 consists of a bar-shaped member whose XZ sectional shape is rectangular (refer to FIG. 3) and longitudinal direction is in the Y-axis direction, and connects the edges on the −Y side of the pair of X support member 61 reciprocally. Here, as it can be seen from FIGS. 1 and 3, interlinking member 62 is mounted on the upper surface of each of the pair of X support members 61, and the Z position of the lower surface is about the same as the Z position of the lower surface of substrate P. Further, as shown in FIG. 2, to the side surface on the −X side of interlinking member 62, an X movable mirror 68x (a bar mirror) having a reflection surface which is orthogonal to the X-axis is attached.

Further, although it is not illustrated, for example, substrate support member 60 is driven in predetermined strokes in the X-axis direction on Y step surface plate 50 by two X linear motors consisting of a pair of stators (for example, a magnet unit including a plurality of permanent magnets arranged in the X-axis direction) fixed on the upper surface of Y step surface plate 50, and a pair of movers (for example, a coil unit including a coil) fixed to the lower surface of each of the pair of X support members 61. By Y step surface plate 50 being driven in predetermined strokes in the Y-axis direction, substrate support member 60 is driven in predetermined strokes in the Y-axis direction integrally with Y step surface plate 50, and concurrently (or independent) with this, by being driven in predetermined strokes in the X-axis direction on Y step surface plate 50, substrate support member 60 is driven in predetermined strokes in the X-axis direction, and the Y-axis direction.

Positional information in the XY plane of substrate support member 60 is obtained by a substrate interferometer system including a pair of X interferometers 66x and a pair of Y interferometers 66y. The pair of X interferometers 66x and the pair of Y interferometers 66y are fixed to device main section 30 via a fixed member which is not illustrated. X interferometer 66x (or Y interferometer 66y) splits light from a light source which is not illustrated using a beam splitter which is not illustrated, irradiates one of the lights serving as a measurement beam on X movable mirror 68x (or Y movable mirror 68y) and the other light serving as a reference beam on a fixed mirror (not illustrated) attached to projection optical system PL (or a member which can be regarded integral with projection optical system PL), respectively, overlays the reflected light from X movable mirror 68x (or Y movable mirror 68y) of the measurement beam and the reflected light from the fixed mirror of the reference beam again and makes the beams enter a light receiving element which is not illustrated, and obtains the position of the reflection surface (that is, displacement of substrate support member 60) of X movable mirror 68x (or Y movable mirror 68y) with the position of the reflection surface of the fixed mirror serving as a reference, based on the interference of the beams.

The X linear motor to drive substrate support member 60 is controlled based on an output of the pair of X interferometers 66x, and the Y linear motor to drive Y step surface plate 50 is controlled based on an output of the pair of Y interferometers 66y (or the Y linear encoder which is not illustrated), respectively. Farther, the distance (and number) between the pair of Y interferometers 66y is set so that a measurement beam from at least one of the Y interferometer 66y is irradiated on Y movable mirror 68y, regardless of the position of substrate support member 60 in the X-axis direction. On the contrary, the distance between the pair of X interferometers 66x set so that each of the measurement beams from the pair of X interferometers 66x are constantly irradiated on X movable mirror 68x, regardless of the position of substrate support member 60 in the Y-axis direction.

In the embodiment, a plurality of air floating devices, e.g., ten, are fixed to the upper surface of Y step surface plate 50. For example, of the ten air floating devices 70, for example, five are on the +X side of opening section 50a, and are placed in the area between the plurality of X linear guides 54 at a predetermined distance in the Y-axis direction, and the other floating devices, for example, five are on the −X side of opening section 50a, and are placed in the area between the plurality of X linear guides 54 at a predetermined distance in the Y-axis direction. For example, each of the ten air floating devices 70 is substantially the same, except for the point that their placement is different.

Each air floating device 70 consists of a rectangular parallelepiped member extending in the X-axis direction (the dimension in the X-axis direction is longer than the dimension in the Y-axis and the Z-axis directions), and the dimension in the longitudinal direction is set to the same level (slightly shorter in actual) as the dimension of the substrate in the X-axis direction. Air floating device 70 has a porous member on the upper surface (a surface facing the lower surface of substrate P), and substrate P is made to float by blowing out pressurized gas (e.g., air) from a plurality of fine pores that the porous member has to the lower surface of substrate P. The pressurized gas can be supplied to air floating device 70 from the outside, or a blower and the like can be built in air floating device 70. Further, the pores for blowing out pressurized gas can be formed by mechanical processing. The floating amount of substrate P by the plurality of air floating device 70 (distance between the upper surface of air floating device 70 and the lower surface of substrate P) is set to around tens of micrometers to thousands of micrometers.

Figure 4:
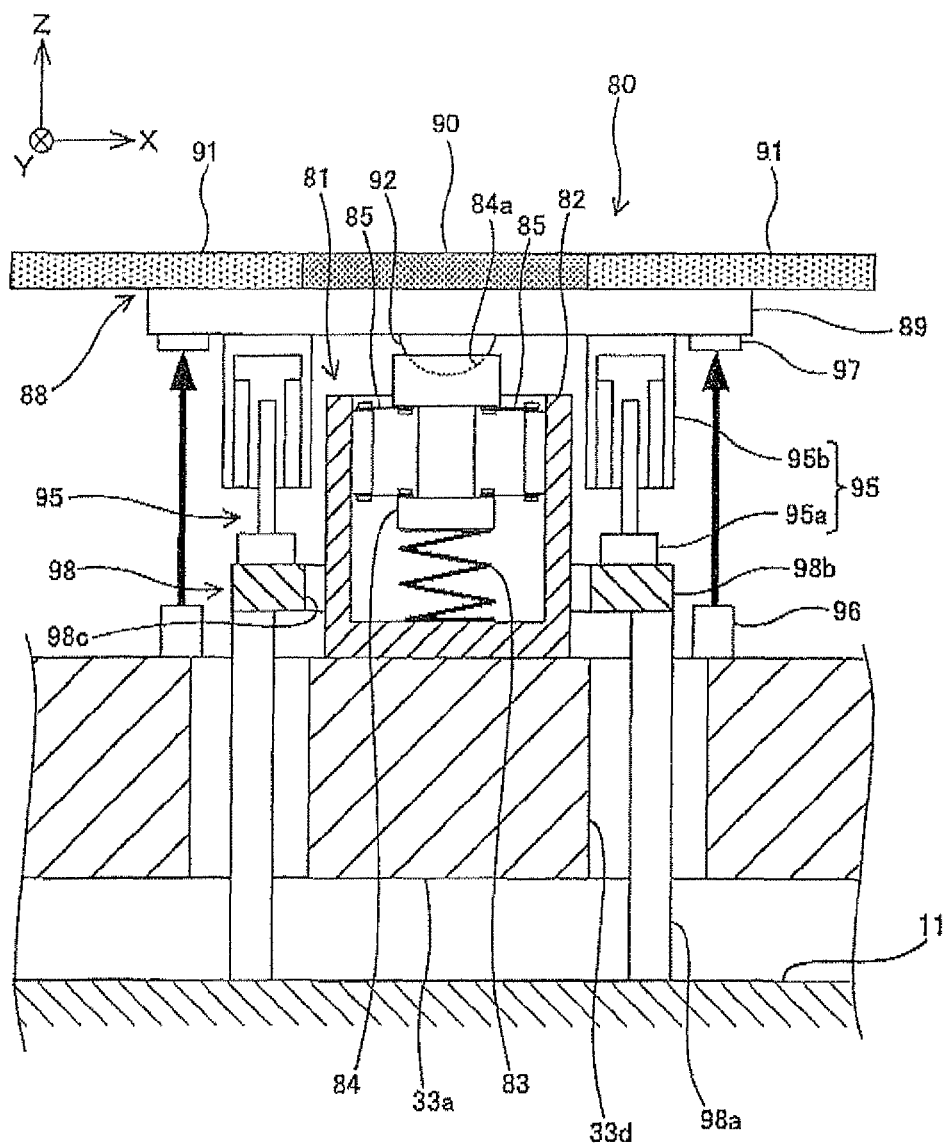
FIG. 4 is a sectional view (a partly enlarged view of FIG. 3) of a fixed point stage device that the substrate stage device has.

As shown in FIG. 4, fixed point stage 80 is equipped with a weight cancellation device 81 mounted on main section 33a of substrate stage mounting 33, an air chuck device 88 supported by weight cancellation device 81 from below, a plurality of Z voice coil motors 95 that drive air chuck device 88 in θx, θy, and Z-axis directions, in directions of a total of three degrees of freedom and the like.

As shown in FIG. 3, weight cancellation device 81 is inserted into opening section 50a formed in Y step surface plate 50. In this case, when Y step surface plate 50 moves in the Y-axis direction in predetermined strokes, the dimension between opening edges that set opening section 50a (and/or the outer dimension of weight cancellation device 81) are set so as to keep the opening edges that set opening section 50a from coming into contact with weight cancellation device 81. Incidentally, if contact of weight cancellation device 81 and Y step surface plate 50 can be avoided when Y step surface plate 50 moves in the Y-axis direction in predetermined strokes, the shape of opening section 50a does not have to be limited in particular, and for example, can be circular.

Referring back to FIG. 4, weight cancellation device 81 is equipped with a housing 82 fixed to main section 33a of substrate stage mounting 33 (refer to FIG. 1), a compression coil spring 83 housed in housing 82 that can expand and contract in the Z-axis direction, a Z slider 84 mounted on compression coil spring 83 and the like. Housing 82 is made up of a cylinder-like member having a bottom which is opened on the +Z side. Z slider 84 consists of a cylinder-like member that extends in the Z-axis, and is connected to an inner wall surface of housing 82 via a plurality of parallel plate spring device 85 each including a pair of plate springs that are parallel to the XY plane and are placed apart in the Z-axis direction.

Parallel plate spring device 85 is placed on the +X side, the −X side, the +Y side, and the −Y side of Z slider 84 (parallel plate spring devices 85 on the +Y side and the −Y side are not illustrated). While relative movement of Z slider 84 with respect to housing 82 in a direction parallel to the XY plane is restricted by the stiffness (extensional stiffness) of the plate springs that parallel plate spring devices 85 have, Z slider 84 is relatively movable with respect to housing 82 in the Z-axis direction with fine strokes due to the flexibility of the plate spring. The upper end (an end on the +Z side) of Z slider 84 projects out upward from the end on the +Z side of housing 82, and supports air chuck device 88 from below. Further, on the upper end surface of Z slider 84, a hemispherical recessed section 84a is formed.

Weight cancellation device 81 negates the weight (a force whose direction of gravitational force is downward (the −Z direction)) of substrate P, Z slider 84, air chuck device 88 and the like) with an elastic force of compression coil spring 83 (a force whose direction of gravitational force is upward (the +Z direction)), which reduces the load of the plurality of Z voice coil motors 95. Incidentally, the weight of air chuck device 88 and the like can also be cancelled using a member whose load can be controlled as in an air spring like the weight cancellation device disclosed in, for example, U.S. Patent Application Publication No. 2010/0018950, instead of compression coil spring 83.

Air chuck device 88 is located above (the +Z side) weight cancellation device 81. Air chuck device 88 has a base member 89, a vacuum preload air bearing 90 fixed on base member 89, and a pair of air floating devices 91 placed on each of the +X side and the −X side of vacuum preload air bearing 90.

Base member 89 consists of a plate shaped member which is placed parallel to the XY plane, and the Z position of the lower surface is placed higher than the Z position of the upper surface of Y step surface plate, as shown in FIG. 3. Referring back to FIG. 4, to the center of the lower surface of base member 89, a spherical air bearing 92 having a bearing surface of a hemispheric shape is fixed. Spherical air bearing 92 is inserted into recess section 84a formed in Z slider 84. This allows air chuck device 88 to be swingably (freely rotatable in the θx and θy directions) supported by Z slider 84 with respect to the XY plane. Incidentally, as a device that swingably supports air chuck device 88 with respect to the XY plane, the device can be a pseudo-spherical bearing device using a plurality of air bearings as disclosed in, for example, U.S. Patent Application Publication No. 2010/0018950, or an elastic hinge device can be used.

As shown in FIG. 2, vacuum preload air bearing 90 consists of a rectangular plate shaped member in a planar view whose longitudinal direction is in the Y-axis direction, and its area is set slightly larger than exposure area IA. Vacuum preload air bearing 90 has a gas blowing hole and a gas suction hole on the upper surface, and injects pressurized gas (e.g., air) from the gas blowing hole toward the lower surface of substrate P, and also suctions the gas between the upper surface and substrate P from the gas suction hole. Vacuum preload air bearing 90 forms a gaseous film having high rigidity between its upper surface and the lower surface of substrate P by balancing the pressure of gas blowing out to the lower surface of substrate P and the negative pressure in between its upper surface and the lower surface of substrate P, and holds substrate P by suction in a non-contact manner via a substantially constant clearance. Flow rate or pressure of the gas that is blown out and the flow rate or pressure of the gas that is suctioned are set so that the distance between the upper surface (substrate holding surface) of vacuum preload air bearing 90 and the lower surface of substrate P is around the level, for example, from several micrometers to tens of micrometers.

Now, as shown in FIG. 2, vacuum preload air bearing 90 is placed right below (the −Z side) projection optical system PL, and suctions and holds an area corresponding to exposure area IA of substrate P located right below projection optical system PL. Because vacuum preload air bearing 90 applies a so-called preload to substrate P, the stiffness of the gaseous film formed in between with substrate P can be increased, and even if substrate P was distorted or warped, the shape of the area of substrate P to be exposed which is located right under the projection optical system can be corrected without fail along the upper surface of vacuum preload air bearing 90. Further, because vacuum preload air bearing 90 does not restrict the position of substrate P in the XY plane, substrate P can perform relative movement with respect to illumination light IL (refer to FIG. 3) along the XY plane, even in a state when the area subject to exposure of substrate P is suctioned and held by vacuum preload air bearing 90. Details of such non-contact type air chuck devices (vacuum preload air bearing) are disclosed in, for example, U.S. Pat. No. 7,607,647 and the like. Incidentally, the pressurized gas blowing out from vacuum preload air bearing 90 can be supplied from outside, or a blower and the like can be incorporated in vacuum preload air bearing 90. Further, the suction device (vacuum device) which suctions the gas in between the upper surface of vacuum preload air bearing 90 and the lower surface of substrate P can be provided similarly outside of vacuum preload air bearing 90, or can be incorporated in vacuum preload air bearing 90. Further, the gas blowing hole and the gas suction hole can be formed by mechanical processing, or a porous material can be used. Further, as a method of vacuum preload, negative pressure can be generated using only positive pressure gas (for example, as in a Bernoulli chuck device) without performing gas suction.

Similar to air floating device 70, each of the pair of air floating devices 91 blow out pressurized air (e.g., air) to the lower surface of substrate P from the upper surface. The Z position of the upper surface of the pair of air floating devices 91 is set substantially the same as the Z position on the upper surface of vacuum preload air bearing 90. Further, as shown in FIG. 3, the Z position on the upper surface of vacuum preload air bearing 90 and the pair of air floating devices 91 is set at a position slightly higher than the Z position on the upper surface of the plurality of air floating devices 70. Therefore, as the plurality of air floating devices 70, a high floating type device which can make substrate P float higher when compared with the pair of air floating devices 91 is used. Incidentally, besides blowing out pressurized gas toward substrate P, the pair of air floating devices 91 can also suction the air between its upper surface and substrate P similar to vacuum preload air bearing 90. In this case, it is desirable to set the suction force so that the load becomes weaker than the preload by vacuum preload air bearing 90.

The plurality of Z voice coil motors 95 each include a Z stator 95a fixed to a base frame 98 installed on floor 11, and a Z mover 95b which is fixed to base member 89, as shown in FIG. 4. Z voice coil motors 95 are placed, for example, on the +X side, the −X side, the +Y side, and the −Y side of weight cancellation device 81 (Z voice coil motors 95 on the +Y side and the −Y side are not illustrated), and can finely drive air chuck device 88 in directions of three degrees of freedom, which are θx, θy, and the Z-axis. Incidentally, the plurality of Z voice coil motors 95 should be placed at least at three noncollinear positions.

Base frame 98 includes a plurality of (e.g., four, corresponding to Z voice coil motor 95) leg sections 98a inserted through each of a plurality of through holes 33d formed in main section 33a, and a main section 98b which is supported from below by the plurality of leg sections 98a. Main section 98b consists of a plate shaped member having an annular shape in a planar view, and weight cancellation device 81 is inserted into an opening 98c formed in the center. The plurality of leg sections 98a are each in a non-contact state with main section 33a, and are vibrationally separated. Accordingly, the reaction force occurring when air chuck device 88 is driven using the plurality of Z voice coil motors 95 does not reach weight cancellation device 81.

Positional information of air chuck device 88 driven using the plurality of Z voice coil motors 95 in the directions of three degrees of freedom is obtained using a plurality of, e.g., four Z sensors 96 in the embodiment, fixed to main section 33a. One each of Z sensors 96 are placed on the +X side, the −X side, the +Y side, and the −Y side of weight cancellation device 81 (Z sensors on the +Y side and the −Y side are not illustrated). Z sensor 96 uses a target 97 fixed to the lower surface of base member 89 of air chuck device 88 to obtain variation in distance in the Z-axis direction of main section 98b (main section 33a) of base frame 98 and base member 89. The main controller which is not illustrated constantly obtains positional information of air chuck device 88 in the Z-axis, θx, and θy directions based on the output of four Z sensors 96, and based on the measurement values, appropriately controls the four Z voice coil motors 95 so as to control the position of air chuck device 88. Because the plurality of Z sensors 96 and target 97 is placed in the vicinity of the plurality of Z voice coil motors 95, control at a high speed with high responsiveness becomes possible. Incidentally, the placement of Z sensors 96 and target 97 can be reversed.

Now, the ultimate position of air chuck device 88 is controlled so that the upper surface of substrate P passing above vacuum preload air bearing 90 is constantly located within the depth of focus of projection optical system PL. The main controller which is not illustrated drives and controls (autofocus control) air chuck device 88 so that the upper surface of substrate P is constantly located within the depth of focus of projection optical system PL (so that projection optical system PL always focuses on the upper surface of substrate P), while monitoring a position (surface position) on the upper surface of substrate P by a surface position measurement system (an autofocus sensor) which is not illustrated. Incidentally, because Z sensors 96 are required to obtain positional information of air chuck device 88 in the Z-axis, the θx, and the θy directions, for example, if the sensors are provided at three noncollinear positions, three sensors are acceptable.

In liquid crystal exposure apparatus 10 (refer to Fig.) which is configured as described above, loading of a mask on mask stage MST by a mask loader which is not illustrated, and loading of substrate P onto substrate support member 60 by a substrate loader which is not illustrated are performed under the control of the main controller which is not illustrated. After that, the main controller executes alignment measurement using an alignment detection system that is not illustrated, and after the alignment measurement has been completed, an exposure operation by the step-and-scan method is performed.

Now, an example of a movement of substrate stage device PST at the time of the exposure operation above will be described based on FIGS. 5A to 8B. Incidentally, in the description below, while the case will be described where four shot areas are set on one substrate (the case when four dies are taken) is explained, the number of shot areas and the placement set on one substrate P can be appropriately changed.

Figure 5A:
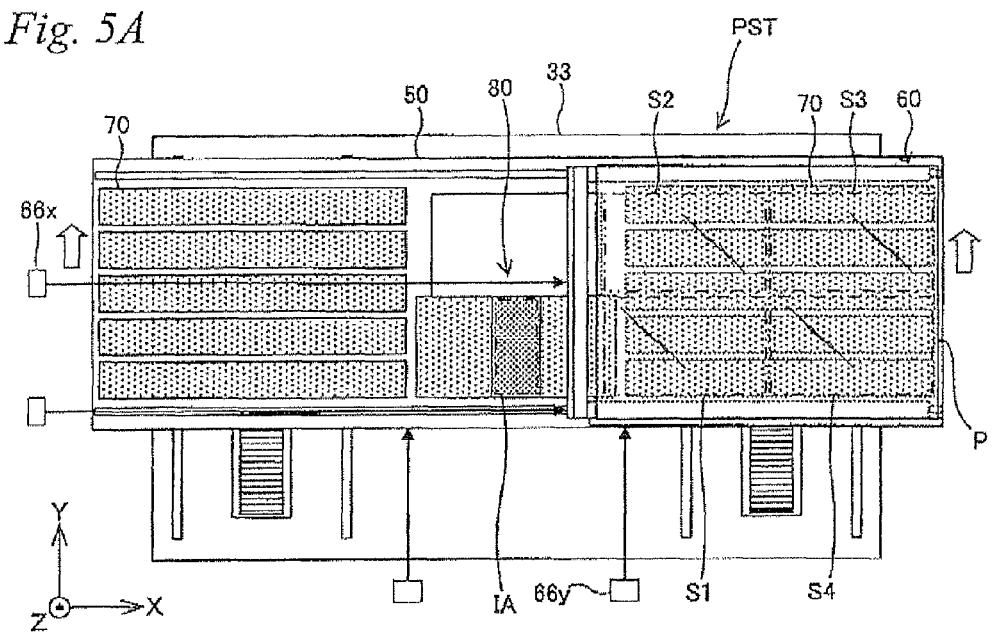
FIGS. 5A and 5B are views (Nos. 1 and 2) used to explain an operation of the substrate stage device at the time of exposure processing.

As an example, as shown in FIG. 5A, the exposure processing is performed in the following order: a first shot area S1 set on the −Y side and the −X side of substrate P; a second shot area 82 set on the +Y side and the −X side of substrate P; a third shot area S3 set on the +Y side and the +X side of substrate P; and a fourth shot area S4 set on the −Y side and the +X side of substrate P. In substrate stage device PST, as shown in FIG. 5A, the position of substrate support member 60 in the XY plane is controlled based on the output of the pair of X interferometers 66x and Y interferometers 66y on the +Y side, so that the first shot area S1 is located on the +X side of exposure area IA.

Figure 5B:
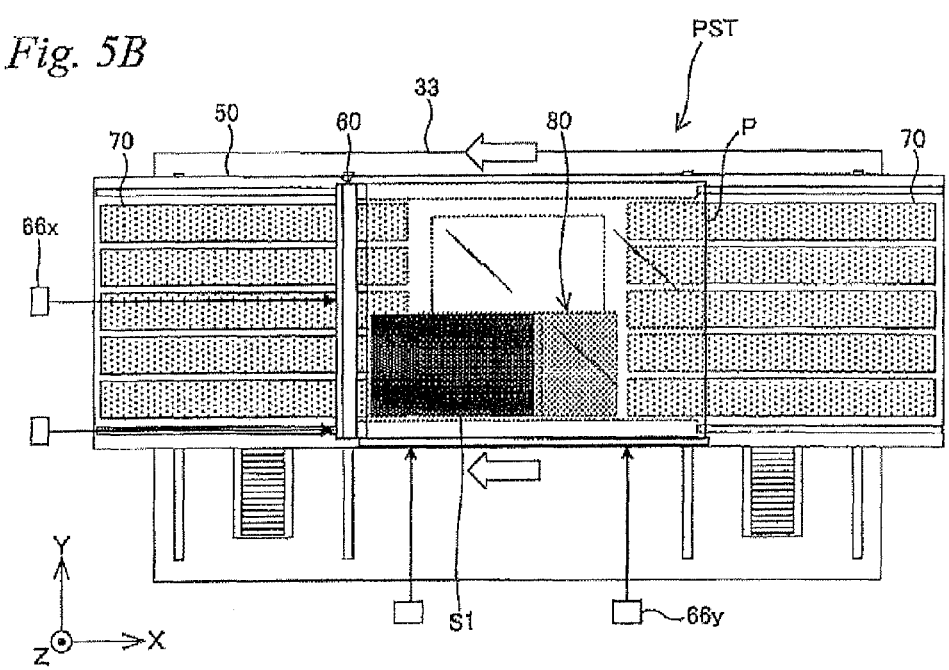
Figure 6A:
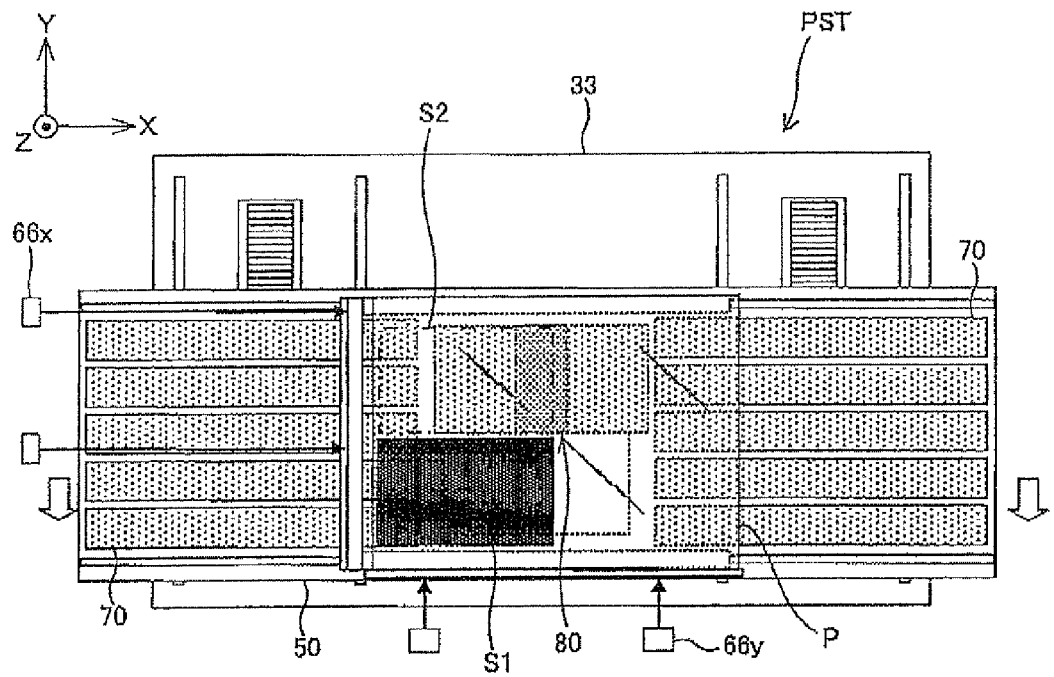
FIGS. 6A and 6B are views (Nos. 3 and 4) used to explain an operation of the substrate stage device at the time of exposure processing.

Then, as shown in FIG. 5B, substrate support member 60 is driven (refer to the arrow in FIG. 5B) with respect to illumination light IL (refer to FIG. 1) in the −X direction at a predetermined constant speed based on the output of the pair of X interferometer 66x, and by this operation, a mask pattern is transferred on the first shot area S1 on substrate P. When exposure processing to the first shot area S1 is completed, as shown in FIG. 6A, substrate stage device PST controls (refer to the arrow in FIG. 6A) the position of substrate support member 60 in the XY plane based on the output of the pair of Y interferometers 66y, so that the edge on the +X side of the second shot area 52 is located slightly on the −X side of exposure area IA (not illustrated in FIG. 6A, refer to FIG. 2).

Figure 6B:
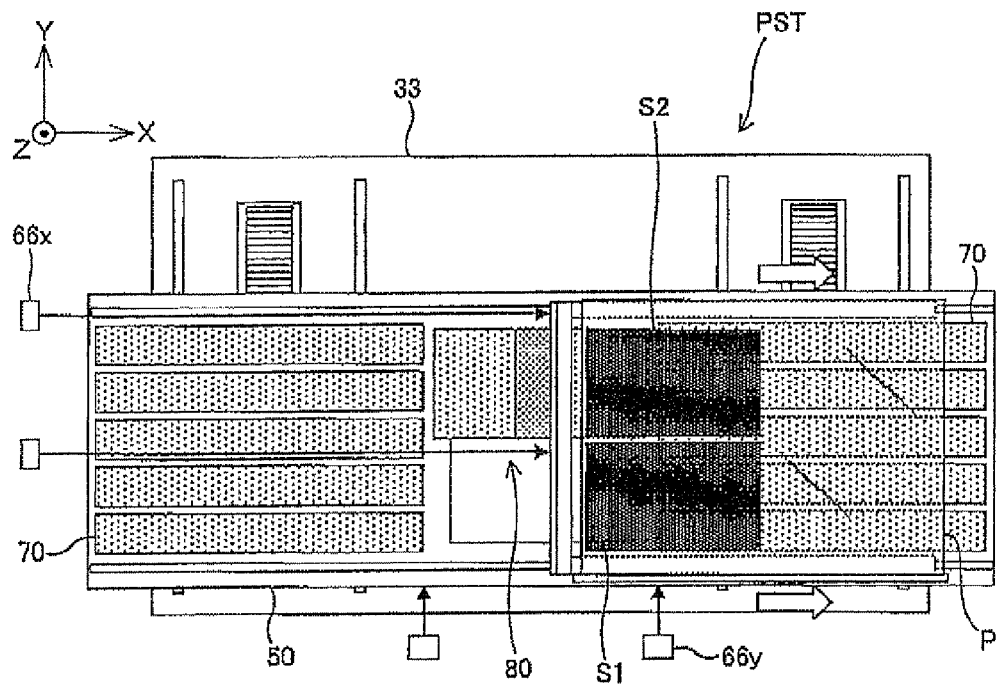
Figure 7A:
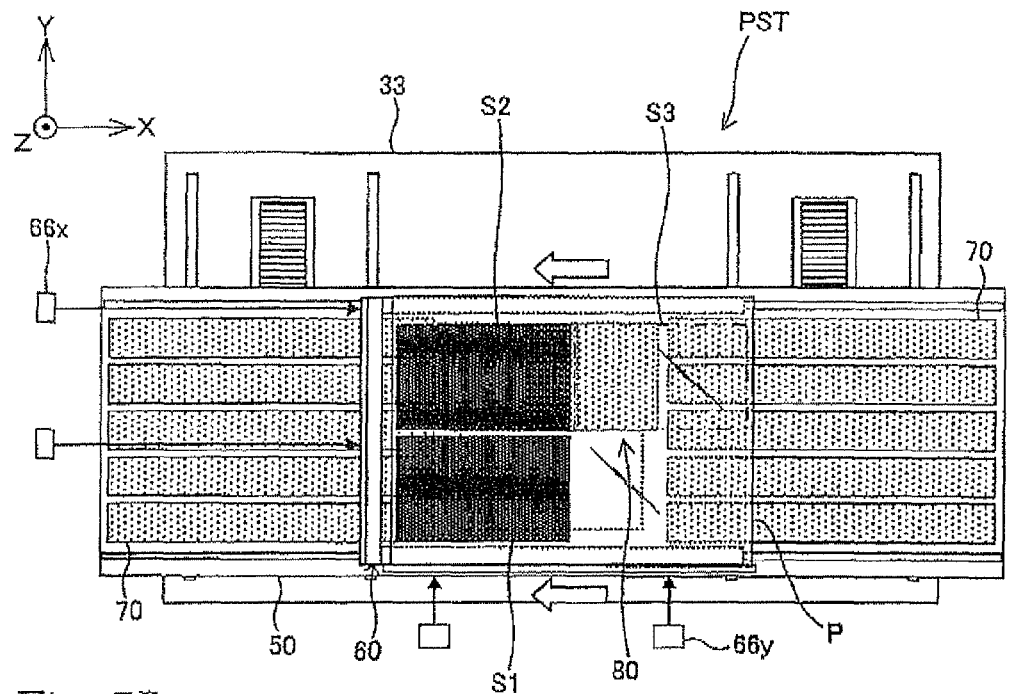
FIGS. 7A and 7B are views (Nos. 5 and 6) used to explain an operation of the substrate stage device at the time of exposure processing.
Figure 7B:
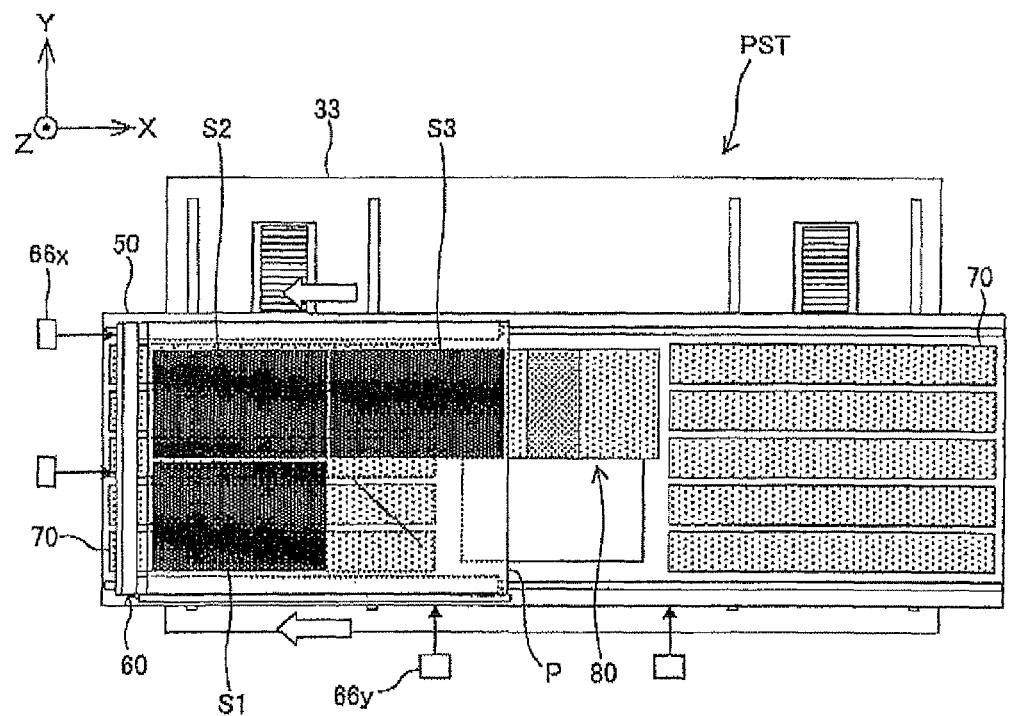

Subsequently, as shown in FIG. 6B, substrate support member 60 is driven (refer to the arrow in FIG. 6B) with respect to illumination light IL (refer to FIG. 1) in the +X direction at a predetermined constant speed based on the output of the pair of X interferometer 66x, and by this operation, a mask pattern is transferred on the second shot area S2 on substrate P. Then, as shown in FIG. 7A, the position of substrate support member 60 in the XY plane is controlled (refer to the arrow in FIG. 7A) based on the output of the pair of X interferometers 66x, so that the edge on the −X side of the third shot area S3 is located slightly on the +X side of exposure area IA (not illustrated in FIG. 7A, refer to FIG. 2), and then substrate support member 60 is driven (refer to the arrow in FIG. 7B) with respect to illumination light IL (refer to FIG. 1) in the −X direction at a predetermined constant speed based on the output of the pair of X interferometer 66x, and by this operation, a mask pattern is transferred on the third shot area S3 on substrate P.

Figure 8A:
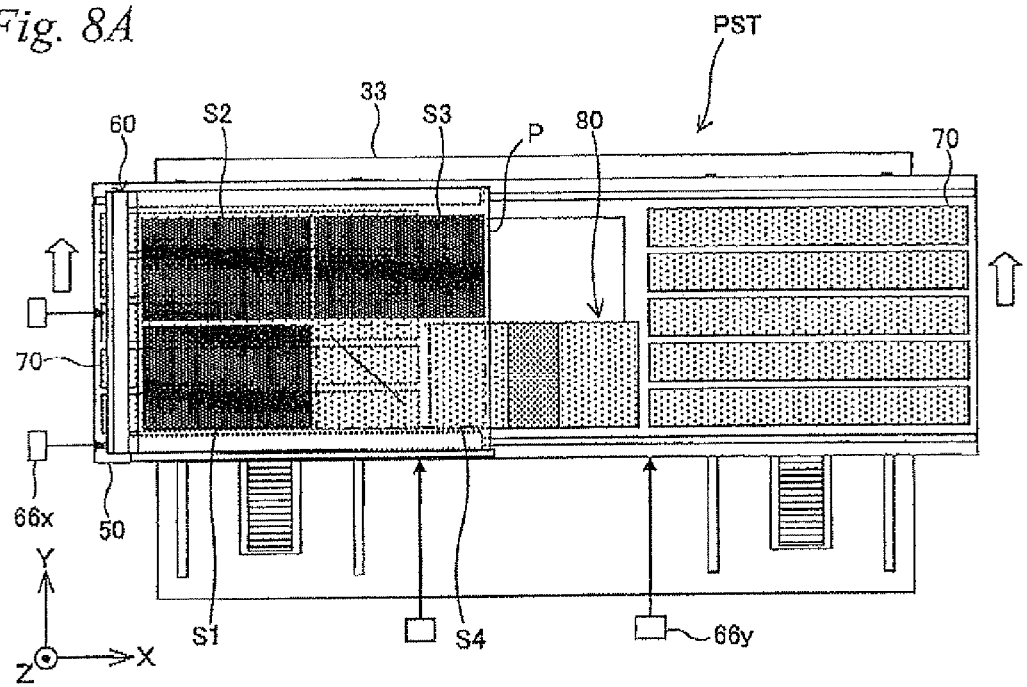
FIGS. 8A and 8B are views (Nos. 7 and 8) used to explain an operation of the substrate stage device at the time of exposure processing.
Figure 8B:
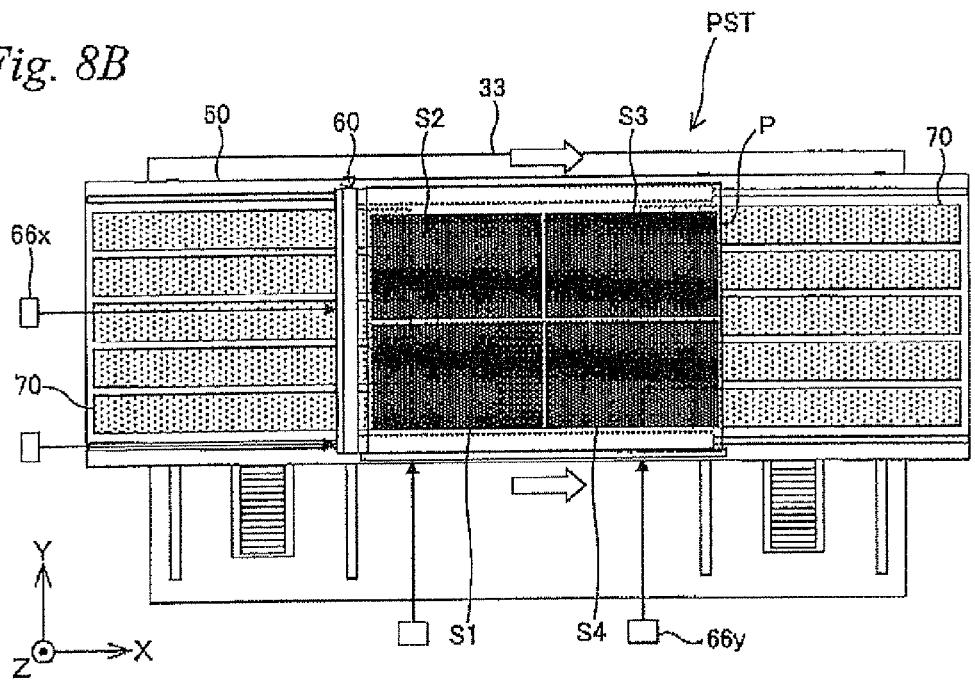

Subsequently, as shown in FIG. 8A, the position of substrate support member 60 in the XY plane is controlled (refer to the arrow in FIG. 8A) based on the output of the pair of Y interferometers 66y, so that the edge on the +X side of the fourth shot area S4 is located slightly on the −X side of exposure area IA (not illustrated in FIG. 8A, refer to FIG. 2), and then substrate support member 60 is driven (refer to the arrow in FIG. 8B) with respect to illumination light IL (refer to FIG. 1) in the +X direction at a predetermined constant speed based on the output of the pair of X interferometer 66x, and by this operation, a mask pattern is transferred on the fourth shot area S4 on substrate P.

While the exposure operation by the step-and-scan method shown in FIGS. 5A to 8B is being performed, the main controller measures the surface position information of the area subject to exposure of the substrate P surface. Then, by controlling the position (surface position) in each of the Z-axis, the θx, and the θy directions of vacuum preload air bearing 90 that air chuck device 88 has based on the measurement values, the main controller positions the substrate P surface so that the surface position of the area subject to exposure located right under projection optical system PL is positioned within the depth of focus of projection optical system PL. This allows the surface position of the area subject to exposure to be positioned without fail within the depth of focus of projection optical system PL, even if, for example, the surface of substrate P was undulated or there was an error in the thickness of substrate P, and the exposure precision can be improved. Further, of substrate P, a large portion besides the area corresponding to exposure area IA is supported by levitation by the plurality of air floating devices 70. Accordingly, bending of substrate P due to its self-weight can be suppressed.

As described, because substrate stage device PST of liquid crystal exposure apparatus 10 of the first embodiment performs pinpoint control of the surface position of the position corresponding to the exposure area on the substrate surface, the weight of the stage device can be largely reduced when compared with the case when a substrate holder (in other words, the entire substrate P) having an area about the same as substrate P is driven in the Z-axis direction and the tilt direction, respectively, like the stage device which is disclosed in, for example, U.S. Patent Application Publication No. 2010/0018950.

Further, because substrate support member 60 is configured to hold only the edges of substrate P, the X linear motor to drive substrate support member 60 requires only a small output, which can reduce running cost even if the size of substrate P increases. Further, it is easy to improve infrastructure such as power-supply facilities and the like. Further, because the X linear motor requires only a small output, initial cost can be reduced. Further, because the output (thrust) of the X linear motor is small, the influence (influence on exposure precision due to vibration) that the drive reaction force has on the overall system is also small. Further, assembly, adjustment, maintenance and the like are easy when compared with the conventional substrate stage device described above. Further, because the number of members are few and each of the members are light, carriage is also easy. Incidentally, while Y step surface plate 50 includes the plurality of air floating devices 70 and is large compared with substrate support member 60, because positioning of substrate P in the Z-axis direction is performed by fixed point stage 80 and air floating devices 70 in themselves only make substrate P float, stiffness is not required, which allows Y step surface plate 50 to be lightweight.

Further, because the floating amount of substrate P by the plurality of air floating devices 70 is set to around tens of micrometers to thousands of micrometers (in other words, the floating amount is larger than fixed point stage 80), contact between substrate P and air floating devices 70 can be prevented even if substrate P is bent or the setting positions of air floating devices 70 have shifted. Further, because the stiffness of pressurized gas blowing out from the plurality air floating devices 70 is relatively low, the load of Z voice coil motors 95 when performing surface position control of substrate P using fixed point stage 80 is small.

Further, because the configuration of substrate support member 60 which supports substrate P is simple, the weight can be reduced. Accordingly, while the reaction force when driving substrate support member 60 reaches device main section 30 via Y step surface plate 50, because the drive reaction force in itself is small, the risk of affecting the exposure precision is small even if device vibration (swaying of device main section 30, or resonance phenomena by vibrational excitation and the like) by the drive reaction force is generated.

Further, while the drive reaction force of Y step surface plate 50 is larger when substrate support member 60 is driven because the weight of Y step surface plate 50 is heavier than substrate support member 60, since Y step surface plate 50 is driven when moving substrate P in the Y-axis direction in long strokes (or in other words, at the time of non-exposure), the risk is low of the device vibration described above caused by the drive reaction force affecting the exposure precision.

Second Embodiment

Figure 9:
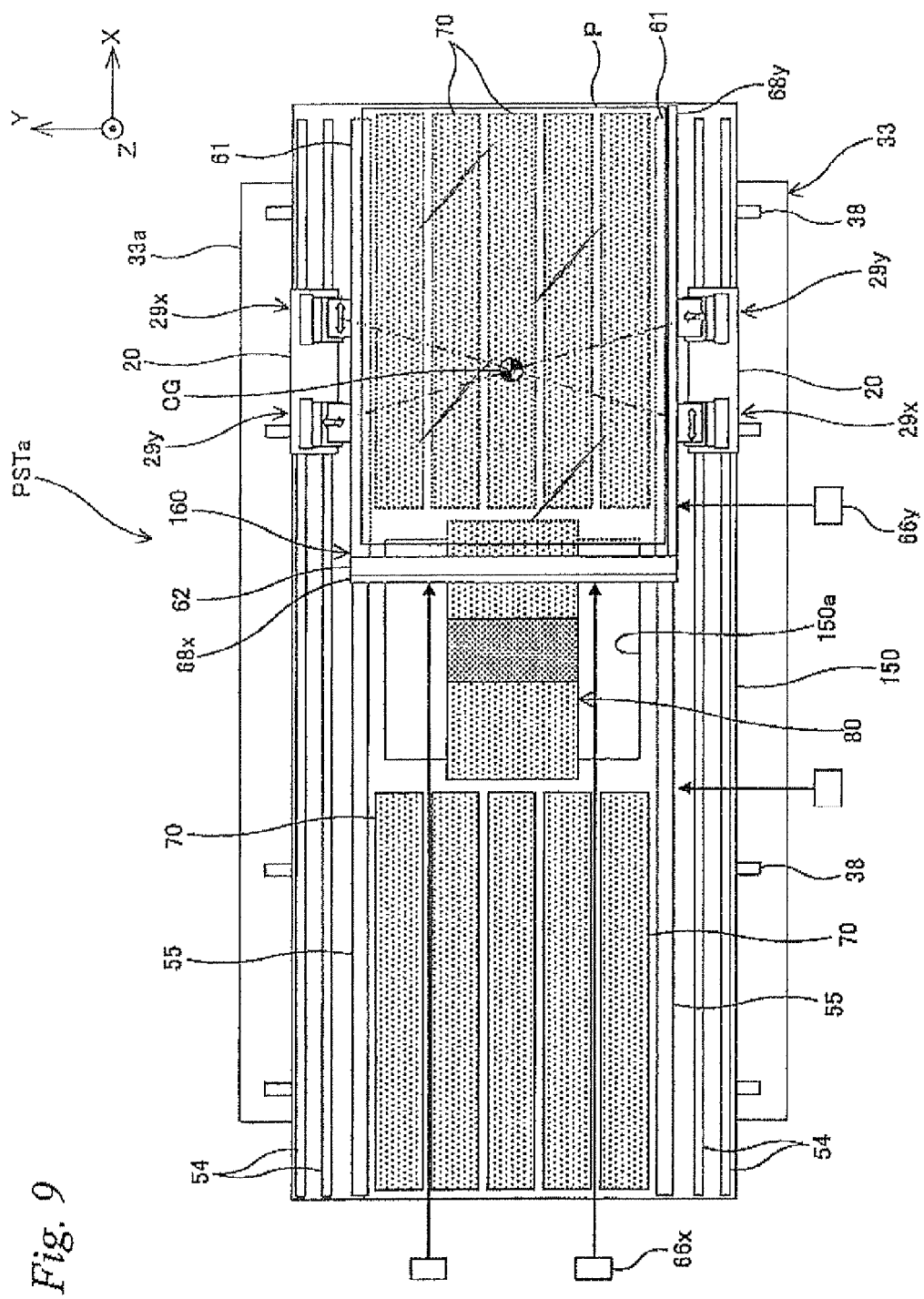
FIG. 9 is a planar view of a substrate stage device related to a second embodiment.
Figure 10:
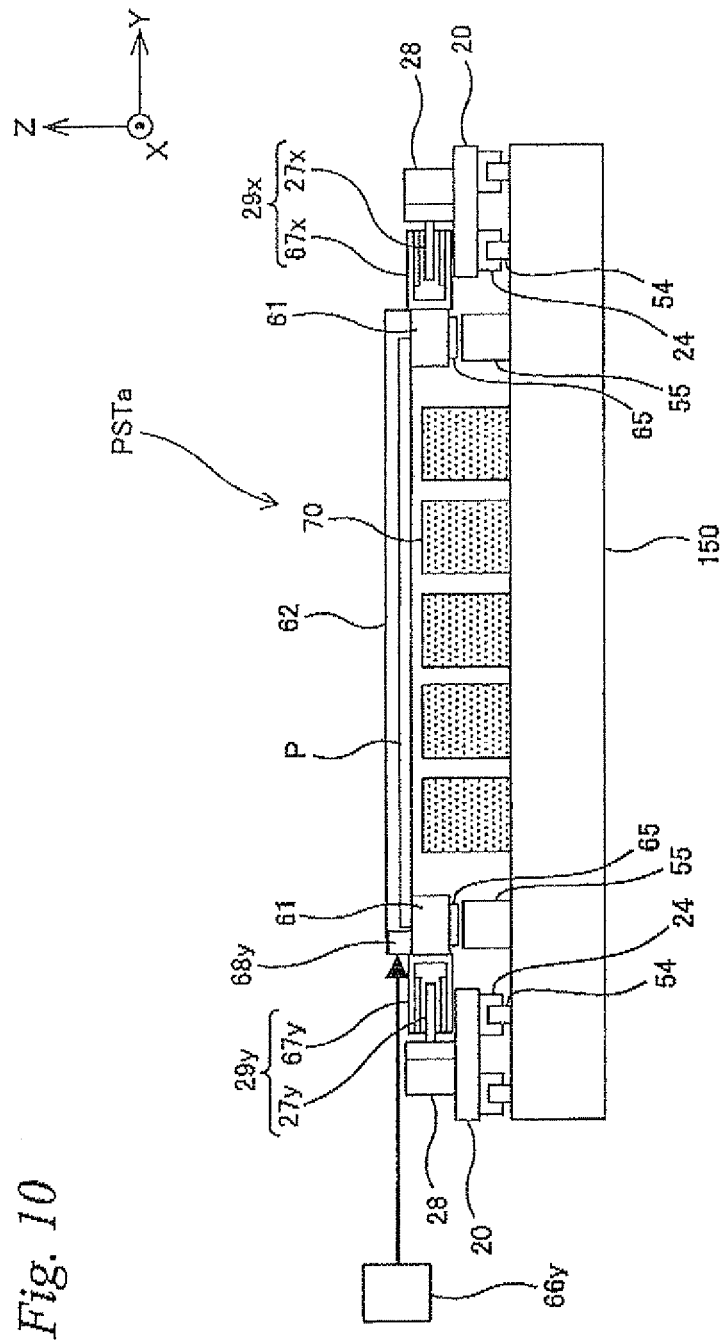
FIG. 10 is a view showing the substrate stage device of FIG. 9 when viewed from the +X side.

Next, a substrate stage device related to a second embodiment is described, based on FIGS. 9 and 10. A substrate stage device PSTa of the second embodiment differs on the point that a substrate support member 160 which supports substrate P can be finely driven in the X-axis, the Y-axis, and the θz directions with respect to Y step surface plate 50. Incidentally, in substrate stage device PSTa of this second embodiment, for members that have the same configuration and function as substrate stage device PST (refer to FIG. 2) of the first embodiment described above, the same reference numerals will be used as in the first embodiment described above, and a description thereabout will be omitted.

Substrate stage device PSTa has a pair of X carriages 20. The pair of X carriages 20 is placed above Y step surface plate 150, on the +Y side and −Y side of substrate support member 160, respectively. Each X carriage 20 consists of a plate shaped member placed parallel to the XY plane that have a rectangular shape in a planar view and whose longitudinal direction is in the X-axis direction, and as shown in FIG. 10, to the lower surface near the four corners, an X slider 24 is fixed (of the four sliders 24, 2 are hidden behind the other two in the depth of the page surface) whose YZ section is an inverted U-shape.

On the contrary, to the upper surface of Y step surface plate 150 near the edges on the +Y side and −Y side, a pair of X linear guides 54 which are placed spaced apart in the Y-axis direction are fixed. X carriage 20 on the +Y side is mounted freely slidable on the pair of X linear guides 54 on the +Y side via X slider 24, and X carriage 20 on the −Y side is mounted freely slidable on the pair of X linear guides 54 on the −Y side via X slider 24. X carriage 20 is driven in predetermined strokes in the X-axis direction on Y step surface plate 150 by an X linear motor that includes an X mover which is not illustrated fixed to X carriage 20, and an X stator fixed to Y step surface plate 150 corresponding to the X mover. Positional information of X carriage 20 is obtained by a Y linear encoder system including a linear encoder head (a detector) which is not illustrated fixed to X carriage 20, and a Y linear scale which is not illustrated fixed to Y step surface plate 150. The pair of X carriages 20 are synchronously driven based on the measurement values of the Y linear encoder system described above.

Further, in the vicinity of an edge on the +Y side and an edge on the −Y side on the upper surface of Y step surface plate 150, on the inner side of the pair of X linear guides 54, X guides 55 are fixed, respectively. X guide 55 consists of a member whose YZ shape is rectangular, extending to the X-axis direction (refer to FIG. 10), and the degree of flatness of the upper surface is set extremely high. The distance between the two X guides 55 is approximately coincides with the distance between the pair of X support members 61 which substrate support member 160 has.

To the lower surface of each of the pair of X support members 61 of substrate support member 160, air bearings 65 whose bearing surfaces face the upper surface of X guides 55 are attached, as shown in FIG. 10. Substrate support member 160 is supported by levitation on the pair of X guides 55, by the operation of air bearings 65. Incidentally, while X sliders 64 (refer to FIG. 1) were fixed to the lower surface of X support members 61 in the first embodiment described above, substrate support member 160 of this the second embodiment does not have X sliders 64.

Referring back to FIG. 9, substrate support member 160 is driven in the X-axis, the Y-axis, and the θz directions with respect to the pair of X carriages 20 in FIG. 9, by two X voice coil motors 29$x$ and two Y voice coil motors 29$y$. One of the two X voice coil motors 29$x$ and one of the two Y voice coil motors 29$y$ are placed on the −Y side of substrate support member 160, and the other of the two X voice coil motors 29$x$ and the other of the two Y voice coil motors 29$y$ are placed on the +Y side of substrate support member 160. One and other X voice coil motors 29$x$ are placed at positions which are symmetric to each other with respect to center of gravity CG of a system that combines both substrate support member 160 and substrate P, and one and other y voice coil motors 29$y$ are placed at positions which are symmetric to each other with respect to center of gravity CG described above.

As shown in FIG. 10, one of (on the −Y side) the Y voice coil motors 29$y$ includes a stator 27$y$ (for example, has a coil unit including a coil) fixed to the upper surface of X carriage 20 that is on the −Y side via a support member 28, and a mover 67$y$ (for example, has a magnet unit including a magnet) fixed to the side surface of X support member 61 that is on the −Y side. Incidentally, while the other (on the +Y side) of the Y voice coil motors 29y (refer to FIG. 9) is hidden below X voice coil motor 29x in the depth of the page surface in FIG. 10, the configuration is the same as the one Y voice coil motor 29y. Further, the other (on the +Y side) of the X voice coil motors 29x includes a stator 27x fixed to the upper surface of X carriage 20 on the +Y side via support member 28, and a mover 67x fixed to the side surface of X support member 61 on the +Y side. Incidentally, while the one of (on the +Y side) the X voice coil motors 29x is hidden below Y voice coil motor 29y in the depth of the page surface in FIG. 10, the configuration is the same as the one other of the X voice coil motor 29x.

Referring back to FIG. 9, when each of the pair of X carriages 20 is driven in predetermined strokes in the X-axis direction on Y step surface plate 150, substrate support member 160 is synchronously driven (driven in the same direction and same speed as the pair of X carriages 20) with respect to the pair of X carriages 20 by the two X voice coil motors 29x. This allows the pair of X carriages 20 and substrate support member 160 to integrally move in the X-axis direction. Further, when Y step surface plate 150 and the pair of X carriages 20 are driven in predetermined strokes in the Y-axis direction, substrate support member 160 is synchronously driven (driven in the same direction and same speed as the pair of X carriages 20) with respect to the pair of X carriages 20 by the two Y voice coil motors 29y. This allows Y step surface plate 150 and substrate support member 160 to integrally move in the Y-axis direction. Further, substrate support member 160 is finely driven appropriately in a direction around an axis parallel to the Z-axis passing through center of gravity CG, by the two X voice coil motors 29x (or the two Y voice coil motors 29y). Positional information within the XY plane (including the θz direction) of substrate P is obtained by the pair of X interferometers 66x. Incidentally, because the operation at the time of the step-and-scan of substrate stage device PSTa in the second embodiment is similar to the first embodiment, the explanation thereabout will be omitted.

According to substrate stage device PSTa related to the second embodiment, adding to the effect which can be obtained in the first embodiment described above, because substrate support member 160 holding substrate P is not in contact with Y step surface plate 150 and is vibrationally separate in the direction parallel to the XY plane, the reaction force of the X linear motor (or Y linear motor) and oscillation that occurs when substrate support member 160 is driven can be kept from travelling. Further, because substrate P can be driven in the cross-scan direction and the θz direction when substrate P is driven in the scanning direction, exposure with higher precision becomes possible. Further, because substrate support member 160 is configured to hold only the edges of substrate P, the voice coil motor to drive substrate support member 160 requires only a small output, which can reduce running cost even if the size of substrate P increases.

Third Embodiment

Next, a third embodiment will be described, with reference to FIGS. 11 to 13A. In the third embodiment, the configuration of device main section 30 and substrate stage device EST differs from the first embodiment (refer to FIG. 1) described above. Incidentally, in device main section 130 and substrate stage device PSTb of this third embodiment, for members that have the same configuration and function as the first embodiment described above, the same reference numerals will be used as in the first embodiment described above, and a description thereabout will be omitted.

Figure 11:
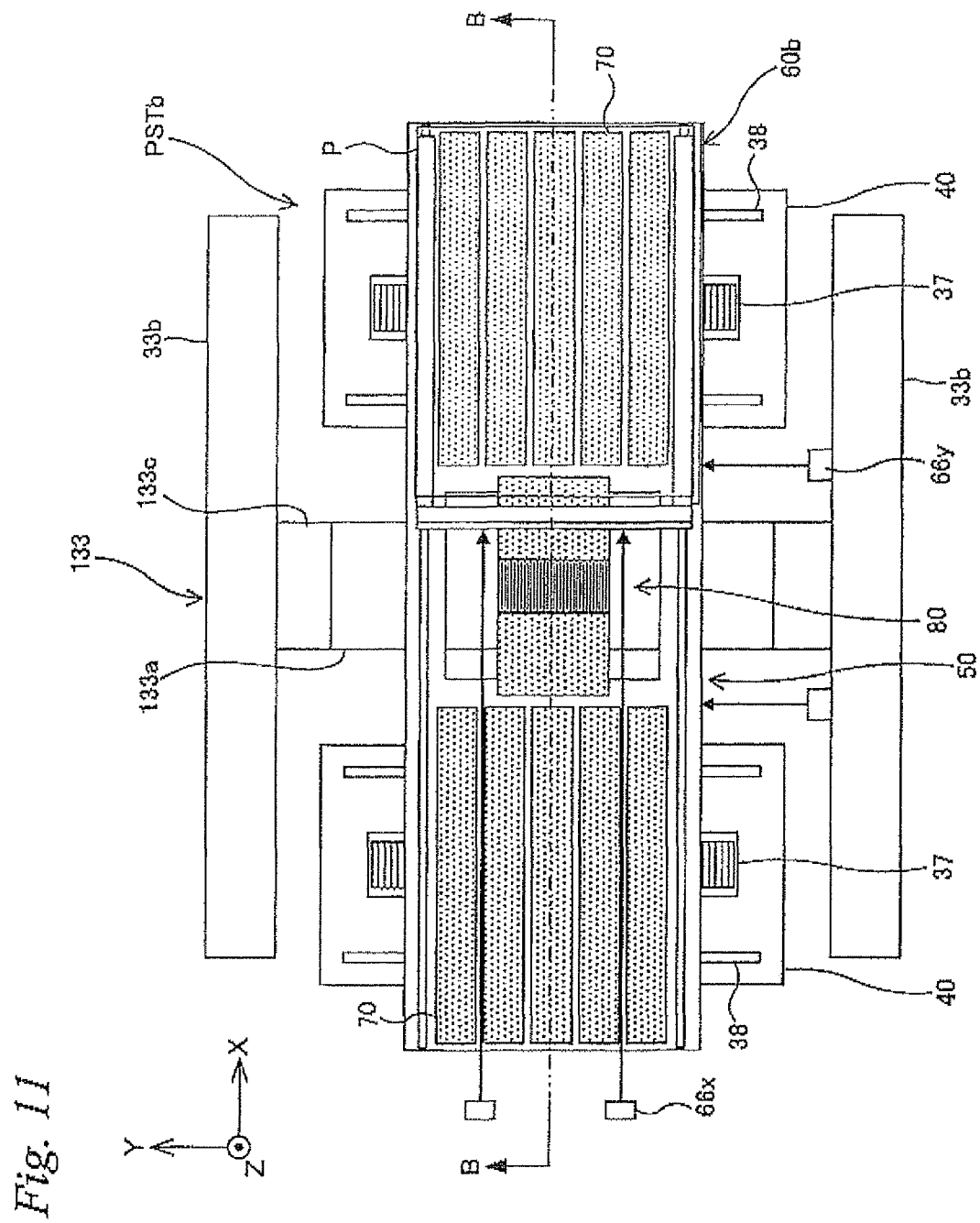
FIG. 11 is a planar view of a substrate stage device related to a third embodiment.
Figure 12A:
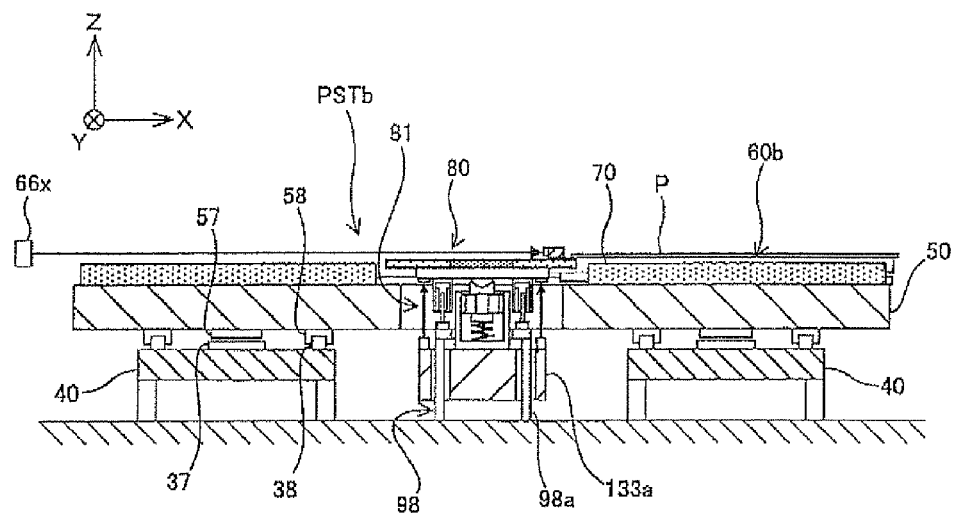
FIG. 12A shows a sectional view of line B-B in FIG. 11.
Figure 12B:
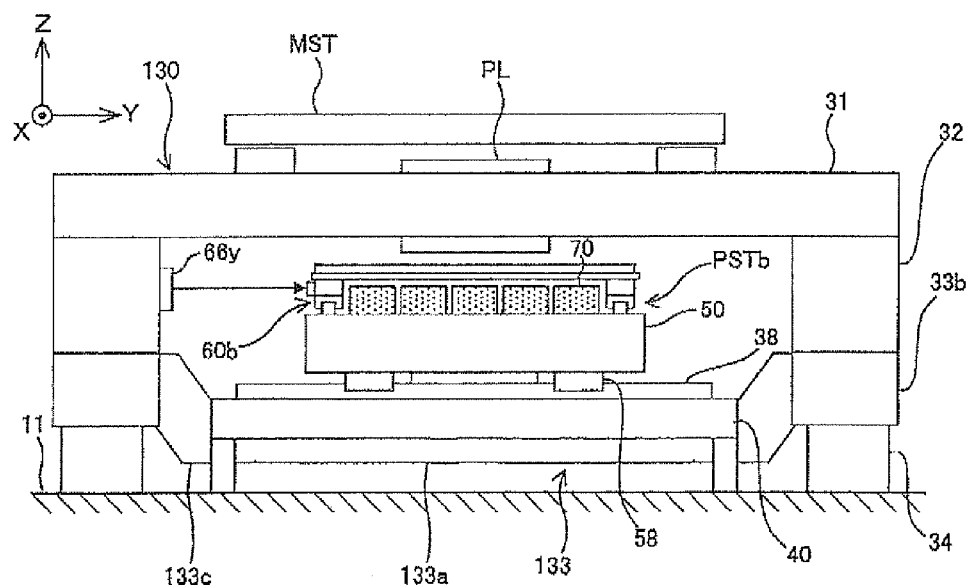
FIG. 12B shows a side view of substrate stage device of FIG. 11 when viewed from the +X side.

As shown in FIG. 12B, substrate stage device PSTb related to the third embodiment is mounted on Y step surface plate 50, which is on a mounting 40 set on floor 11. As shown in FIG. 11, substantially the same mounting is provided spaced apart in the X-axis direction as a pair for mounting 40, and Y step surface plate 50 is mounted installed over the two mountings 40. To each of the upper surfaces of the pair of mountings 40, as shown in FIGS. 11 and 12A, a plurality of Y linear guide members 38 to guide Y step surface plate 50 straight in the Y-axis direction, and a Y stator 37 configuring the Y linear motor to drive Y step surface plate 50 in the Y-axis direction are fixed.

Further, as shown in FIG. 11, in main section 130, dimensions in the X-axis direction of main section 133a of substrate stage mounting 133 and connection 133c are set shorter than main section 33a and connection 33c (each refer to FIG. 1) in the first embodiment. Main section 133a is laid across the pair of support sections 33b in the center of the longitudinal direction. On main section 133a, as shown in FIG. 12 A), weight cancellation device 81 of fixed point stage 80 is mounted. Further, in main section 133a, through-holes are formed where leg sections 98a of base frame 98 pass through.

Now, as shown in FIG. 11, one of the pair of mountings described above is placed on the +X side of main section 133a and the other is placed on the −X side separated (distanced) from main section 133a, respectively, and is vibrationally separated with respect to substrate stage mount 133 (or in other words, main section 130 (refer to FIG. 12(C))). Accordingly, the reaction force and the vibration that occurs when Y step surface plate 50 is driven in the Y-axis direction can be kept from travelling to device main section 130.

Figure 13A:
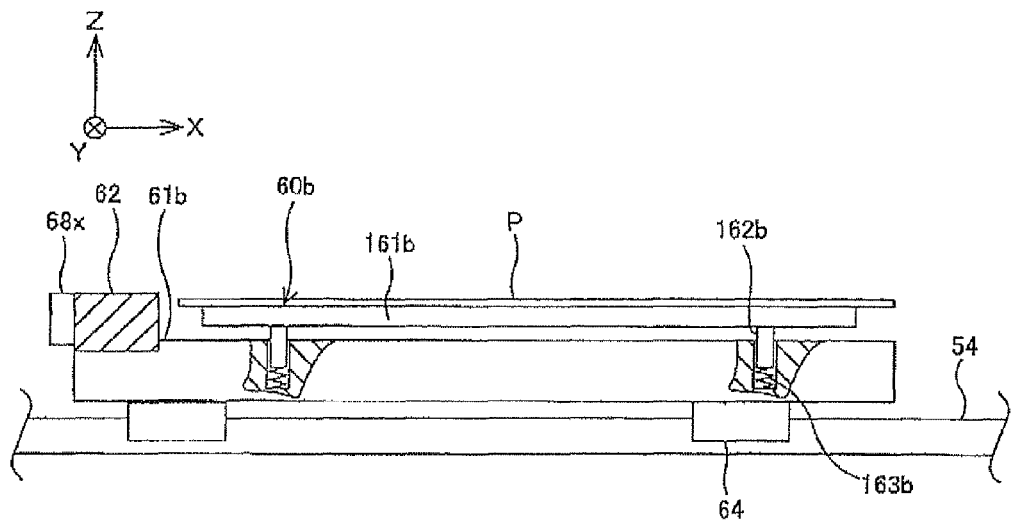
FIG. 13A is a sectional view of the substrate support member that the substrate stage device of FIG. 11 has.
Figure 13B:
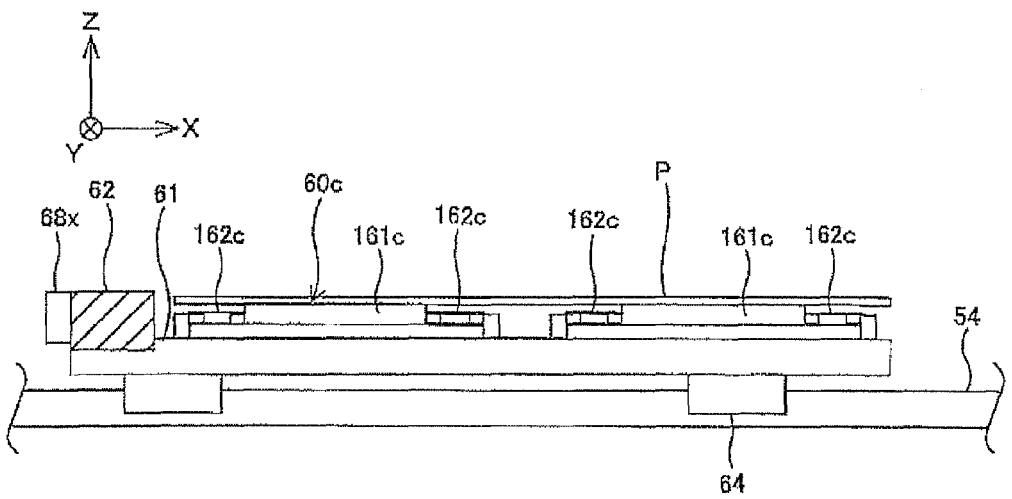
FIG. 13B is a view showing a modified example of the substrate support member related to the third embodiment.

Further, in substrate stage device PSTb related to the third embodiment, because fixed point stage 80 is mounted on main section 133a which is a part of device main section 130 and Y step surface plate 50 is mounted on the pair of mountings 40, the Z position (the Z position of the movement plane when substrate support member 60b moves parallel to the XY plane) of substrate support member 60b and the Z position of fixed point stage 80 may change, for example, by the operation of vibration isolator 34. Therefore, in the third embodiment, substrate support member 60b holds substrate P by suction (so as not to restrict substrate P in the Z-axis direction) using a holding member 161b which is finely movable in the Z-axis direction with respect to X support member 61b as shown in FIG. 13A (holding member 161b is not illustrated in FIGS. 11 and 12B). Holding member 161b consists of a bar-shaped member extending in the X-axis direction, and has adsorption pads (the piping for vacuum suction is not illustrated) which are not illustrated on its upper surface. In the vicinity of both ends in the longitudinal direction to each of the lower surface of holding member 161b, a pin 162b extruding downward (to the −Z side) is attached. Pin 162b is inserted into a recess section formed on the upper surface of X support member 61b, and is supported from below by a compression coil spring housed in the recess section. This allows holding member 161b (in other words, substrate P) to move in the Z-axis direction (the vertical direction) with respect to X support member 61b. Accordingly, even if the Z position of substrate support member 60b and the Z position of fixed point stage 80 shifts as described above, because substrate P moves (vertically) in the Z-axis direction with respect to X support member 61b according to the Z position of air floating device 70, the load in the Z-axis direction with respect to substrate P is suppressed. Incidentally, as in substrate support member 60c shown in FIG. 13B, a configuration in which a holding member 161c having adsorption pads which are not illustrated is finely movable in the Z-axis direction with respect to the X support member 61, using a plurality of parallel plate spring devices 162c can also be employed. Further, in the third embodiment, substrate support member 60b (or 60c) can be configured finely movable in the Y-axis direction and the θz direction with respect to Y step surface plate, as in the second embodiment described above.

Incidentally, configuration of the liquid crystal exposure apparatus in the first to third embodiments described above can be changed appropriately. For example, while substrate support members 60 and 160 related to the first and second embodiments described above were configured so that substrate P was held by suction from below, besides this, the substrate can be held, for example, by a pressing device which presses (from one side of X support member 61 to the other side of X support member 61) the edge of substrate P in the Y-axis direction. In this case, exposure processing can be performed on substantially the entire surface of substrate P.

Further, the single axis guide which guides Y step surface plates 50, 150 and substrate support members 60, 160, 60b, 60c straight, for example, can be a non-contact type single axis guide including a guide member made of a stone material, ceramics or the like, and a plurality of static gas bearings (air bearings).

Further, the drive device used to drive Y step surface plates 50, 150 and substrate support members 60, 160, 60b, 60c can be a feed screw device which is a combination of a ball screw and a rotary motor, a belt drive device which is a combination of a belt (or a rope) and a rotary motor, and the like.

Further, positional information of substrate support members 60, 160, 60b, and 60c can be obtained using a linear encoder system. Further, positional information of each of the pair of X support members 61 (61b in the third embodiment described above) that substrate support members 60, 160, 60b, and 60c have can be obtained independently using the linear encoder system, and in this case, the pair of X support members do not have to be mechanically connected (inter-linking member 62 will not be necessary).

Further, in fixed point stage 80 (refer to FIG. 4), in the case the drive reaction force of stator 95a of Z voice coil motor 95 which drives air chuck device 88 is small enough so that the influence on device main section 30 can be ignored, stator 95a can be fixed to substrate stage mounting 33 (main section 133a in the third embodiment described above).

Further, in fixed point stage 80, air chuck device 88 can be configured movable in the X-axis direction, and before the scanning exposure operation begins, vacuum preload air bearing 90 can be positioned to be at the upstream side (for example, the +X side of exposure area IA before exposure of the first shot area S1, as shown in FIG. 5A) of the movement direction of substrate P where surface position adjustment of the upper surface of substrate P can be performed in advance, and then with substrate P moving in the scanning direction, air chuck device 88 can be synchronously moved with substrate P (substrate support member 60) (air chuck device 88 is to be stopped right under exposure area IA during exposure).

Further, in the first embodiment described above, while minor positioning of substrate P in the Y-axis direction and the θz direction is not performed at the time of scanning exposure, in this case, positioning can be performed by configuring mask stage MST to be finely drivable in the Y-axis direction and the θz direction, and making mask M follow substrate P.

Further, a counter mass can be provided so as to reduce the drive reaction force that occurs when driving movable members such as Y step surface plate 50, substrate support member 60 and the like using a linear motor.

Further, the illumination light can be an ultraviolet light such as an ArF excimer laser light (with a wavelength of 193 nm), or a KrF excimer laser light (with a wavelength of 248 nm), or a vacuum ultraviolet light such as an F2 laser light (with a wavelength of 157 nm). Further, as the illumination light, a harmonic wave, which is obtained by amplifying a single-wavelength laser light in the infrared or visible range emitted by a DFB semiconductor laser or fiber laser with a fiber amplifier doped with, for example, erbium (or both erbium and ytterbium), and by converting the wavelength into ultraviolet light using a nonlinear optical crystal, can also be used. Further, solid state laser (with a wavelength of 355 nm, 266 nm) or the like can also be used.

Further, while, in each of the embodiments described above, the case has been described where projection optical system PL is the projection optical system by a multi-lens method that is equipped with a plurality of projection optical units, the number of the projection optical units is not limited thereto, but there should be one or more projection optical units. Further, the projection optical system is not limited to the projection optical system by a multi-lens method, but can be a projection optical system using, for example, a large mirror of the Offner type, or the like.

Further, while the case has been described where the projection optical system whose projection magnification is equal magnification is used as projection optical system PL in each of the embodiment described above, as well as this, the projection optical system can be either of a reduction system or a magnifying system.

Incidentally, in each of the embodiments above, a light transmissive type mask is used, which is obtained by forming a predetermined light-shielding pattern (or a phase pattern or a light-attenuation pattern) on a light transmissive mask substrate. Instead of this mask, however, as disclosed in, for example, U.S. Pat. No. 6,778,257, an electron mask (a variable shaped mask) on which a light-transmitting pattern, a reflection pattern, or an emission pattern is formed according to electronic data of the pattern that is to be exposed, for example, a variable shaped mask that uses a DMD (Digital Micromirror Device) that is a type of a non-emission type image display element (which is also called a spatial light modulator) can also be used.

Incidentally, it is particularly effective to apply the exposure apparatus to an exposure apparatus which exposes a substrate whose size (including at least one of the external diameter, diagonal line, and one side) is 500 mm or more, such as, for example, a large substrate of a flat panel display (FPD) such as the liquid crystal display and the like.

Further, the exposure apparatus can also be adapted also to a step-and-repeat type exposure apparatus, and a step-and-stitch type exposure apparatus.

Further, the application of the exposure apparatus is not limited to the exposure apparatus for liquid crystal display elements in which a liquid crystal display element pattern is transferred onto a rectangular glass plate, but each of the embodiments above can also be widely applied, for example, to an exposure apparatus for manufacturing semiconductors, and an exposure apparatus for producing thin-film magnetic heads, micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or a reticle used in a light exposure apparatus, an EUV exposure apparatus, an X-ray exposure apparatus, an electron-beam exposure apparatus, and the like. Incidentally, an object that is subject to exposure is not limited to a glass plate, but for example, can be another object such as a wafer, a ceramic substrate, a film member or a mask blank. Further, in the case where an exposure subject is a substrate for flat-panel display, the thickness of the substrate is not limited in particular, and for example, a film like member (a sheet like member having flexibility) is also included.

Further, the movable body apparatus (stage device) which moves an object along a predetermined two-dimensional plane is not limited to an exposure apparatus, and can also be applied to an object processing device that performs a predetermined processing on an object, such as in an object inspection equipment used for inspection of the object.

Incidentally, the disclosures of all the U.S. patent application Publications and the U.S. patents that are cited in the description so far related to exposure apparatuses and the like are each incorporated herein by reference.

Device Manufacturing Method

A manufacturing method of a microdevice that uses the exposure apparatus related to each of the embodiments above in a lithography process is described next. In exposure apparatus 10 of the embodiment described above, liquid crystal display as the micro device can be obtained by forming a predetermined pattern (a circuit pattern, an electrode pattern) on a plate (a glass substrate).

Pattern Forming Process

First of all, a so-called optical lithography process in which a pattern image is formed on a photosensitive substrate (such as a glass substrate coated with a resist) is executed using the exposure apparatus related to each of the embodiments above described above. In this optical lithography process, a predetermined pattern that includes many electrodes and the like is formed on the photosensitive substrate. After that, the exposed substrate undergoes the respective processes such as a development process, an etching process and a resist removing process, and thereby the predetermined pattern is formed on the substrate.

Color Filter Forming Process

Next, a color filter in which many sets of three dots corresponding to R (Red), G (Green) and B (blue) are disposed in a matrix shape, or a color filter in which a plurality of sets of filters of three stripes of R, G and B are disposed in horizontal scanning line directions is formed.

Cell Assembling Process

Next, a liquid crystal panel (a liquid crystal cell) is assembled using the substrate having the predetermined pattern obtained in the pattern forming process, the color filter obtained in the color filter forming process, and the like. For example, a liquid crystal panel (a liquid crystal cell) is manufacture by injecting liquid crystal between the substrate having the predetermined pattern obtained in the pattern forming process and the color filter obtained in the color filter forming process.

Module Assembling Process

After that, a liquid crystal display element is completed by attaching respective components such as an electric circuit that causes a display operation of the assembled liquid crystal panel (liquid crystal cell) to be performed, and a backlight.

In this case, since exposure of the substrate is performed with high throughput and high precision using the exposure apparatus related to each of the embodiments described above in the pattern forming process, the productivity of liquid crystal display elements can be improved as a consequence.

While each of the above-described embodiments of the present invention is the presently preferred embodiment thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body apparatus, comprising:
   a first movable body which holds an edge of an object placed along a predetermined two-dimensional plane that is parallel to a horizontal plane, and is movable with predetermined strokes at least in a first direction within the two-dimensional plane; and
   a second movable body which includes an object support member that supports the object from below within a movable range in the first direction of the first movable body, and is movable in a second direction orthogonal to the first direction within the two-dimensional plane along with the first movable body.

2. The movable body apparatus according to claim 1 wherein
   the first movable body is guided on the second movable body in the first direction by a single axis guide device including a guide member provided in the second movable body, and relative movement of the first movable body in the second direction with respect to the second movable body is restricted by the guide device.

3. The movable body apparatus according to claim 1 wherein
   the first movable body is driven in the first direction on the second movable body by a linear motor including a stator provided in the second movable body and a mover provided in the first movable body.

4. The movable body apparatus according to claim 1, the apparatus further comprising:
   a third movable body which is movable in the first direction on the second movable body, wherein
   the first movable body moves in the first direction by being induced by the third movable body, and is finely driven in the second direction or a direction around an axis orthogonal to the two-dimensional plane, or in the second direction and the direction around the axis orthogonal to the two-dimensional plane, with respect to the third movable body.

5. The movable body apparatus according to claim 4 wherein
   the first movable body is mounted on the second movable body in a non-contact state.

6. The movable body apparatus according to claim 1 wherein
   the object support member supports the object in a non-contact manner.

7. The movable body apparatus according to claim 6 wherein
   the object support member supports the object in a non-contact manner by blowing out pressurized gas toward the lower surface of the object.

8. The movable body apparatus according to claim 1, the apparatus further comprising:
   an interferometer system which irradiates a measurement beam on a reflection surface that the first movable body has and also receives its reflected light, and obtains positional information of the first movable body based on the reflected light, wherein
   a position of the first movable body within the two-dimensional plane is controlled, based on an output of the interferometer system.

9. The movable body apparatus according to claim 1, the apparatus further comprising:
an adjustment device which includes a holding device that has a holding surface smaller than an area of the object, and by holding the object from below using the holding device at a part of the object facing the holding surface, adjusts a position in a direction crossing the two-dimensional plane.

10. The movable body apparatus according to claim 9 wherein
the holding device holds the object in a non-contact manner.

11. The movable body apparatus according to claim 10 wherein
the adjustment device blows out gas from the holding device to the object, and also suctions gas in between the holding device and the object so that a load is applied in a direction of gravitational force to the object, and holds the object in a non-contact manner.

12. The movable body apparatus according to claim 9 wherein
a position within the two-dimensional plane of the adjustment device is fixed.

13. The movable body apparatus according to claim 12 wherein
the adjustment device is mounted on a first base member, and
the second movable body moves in the second direction on a second base member which is vibrationally separated from the first base member.

14. The movable body apparatus according to claim 13 wherein
the first movable body movably holds the object in a direction crossing the predetermined two-dimensional plane.

15. The movable body apparatus according to claim 12 wherein
the object support member supports the object at one side and the other side of the adjustment device in the first direction.

16. The movable body apparatus according to claim 9 wherein
the adjustment device further has a weight cancellation device that cancels weight of the holding device.

17. An object processing device, comprising:
the movable body apparatus according to claim 9; and
an execution device which executes a predetermined operation to the object to the part held by the holding device from a side opposite to the holding device to perform a predetermined processing on the object.

18. The object processing device according to claim 17 wherein
the execution device is an apparatus which forms a predetermined pattern on the object using an energy beam.

19. An exposure apparatus, the apparatus comprising:
the movable body apparatus according to claim 1; and
a pattern formation device which exposes the object with an energy beam and forms a predetermined pattern on the object.

20. The exposure apparatus according to claim 19 wherein
the object is a substrate used in a flat panel display.

21. A flat-panel display manufacturing method, comprising:
exposing the substrate using the exposure apparatus according to claim 20; and
developing the substrate that has been exposed.

22. A device manufacturing method, comprising:
exposing the object using the exposure apparatus according to claim 19; and
developing the object that has been exposed.

23. An exposure apparatus that exposes an object with an energy beam and forms a predetermined pattern on the object, the apparatus comprising:
a first movable body which holds an edge of the object placed along a predetermined two-dimensional plane that is parallel to a horizontal plane, and is movable with predetermined strokes at least in a first direction within the two-dimensional plane;
a second movable body which includes an object support member that supports the object from below within a movable range in the first direction of the first movable body, and is movable in a second direction orthogonal to the first direction within the two-dimensional plane along with the first movable body; and
an exposure system which exposes the object with the energy beam.

24. The exposure apparatus according to claim 23 wherein
the first movable body is guided on the second movable body in the first direction by a single axis guide device including a guide member provided in the second movable body, and relative movement of the first movable body in the second direction with respect to the second movable body is restricted by the guide device.

25. The exposure apparatus according to claim 23 wherein
the first movable body is driven in the first direction on the second movable body by a linear motor including a stator provided in the second movable body and a mover provided in the first movable body.

26. The exposure apparatus according to claim 23, the apparatus further comprising:
a third movable body which is movable in the first direction on the second movable body, wherein
the first movable body moves in the first direction by being induced by the third movable body, and is finely driven in the second direction or a direction around an axis orthogonal to the two-dimensional plane, or in the second direction and the direction around the axis orthogonal to the two-dimensional plane, with respect to the third movable body.

27. The exposure apparatus according to claim 26 wherein
the first movable body is mounted on the second movable body in a non-contact state.

28. The exposure apparatus according to claim 23 wherein
the object support member supports the object in a non-contact manner.

29. The exposure apparatus according to claim 28 wherein
the object support member supports the object in a non-contact manner by blowing out pressurized gas toward the lower surface of the object.

30. The exposure apparatus according to claim 23, the apparatus further comprising:
a measuring device which measures positional information of the first movable body, wherein
a position of the first movable body within the two-dimensional plane is controlled, based on measurement information of the measuring device.

31. The exposure apparatus according to claim 23, the apparatus further comprising:
an adjustment device which includes a holding device that has a holding surface smaller than an area of the object, and by holding the object from below with the holding device at a part of the object facing the holding surface, adjusts a position in a direction crossing the two-dimensional plane.

32. The exposure apparatus according to claim 31 wherein the holding device holds the object in a non-contact manner.

33. The exposure apparatus according to claim 32 wherein the adjustment device holds the object in a non-contact manner by a balance between static pressure which occurs between the holding device and the object by pressurized gas blowing out from the holding device, and negative pressure which occurs between the holding device and the object by vacuum suction.

34. The exposure apparatus according to claim 31 wherein a position within the two-dimensional plane of the adjustment device is fixed.

35. The exposure apparatus according to claim 34 wherein the adjustment device is mounted on a first base member, and the second movable body moves in the second direction on a second base member which is vibrationally separated from the first base member.

36. The exposure apparatus according to claim 35 wherein the first movable body movably holds the object in a direction crossing the predetermined two-dimensional plane.

37. The exposure apparatus according to claim 34 wherein the object support member supports the object at one side and the other side of the adjustment device in the first direction.

38. The exposure apparatus according to claim 31, wherein the adjustment device further has a weight cancellation device that cancels weight of the holding device.

39. The exposure apparatus according to claim 23 wherein the object is a substrate used in a flat panel display.

40. A flat-panel display manufacturing method, comprising:
   exposing the substrate using the exposure apparatus according to claim 39; and
   developing the substrate that has been exposed.

41. A device manufacturing method, comprising:
   exposing the object using the exposure apparatus according to claim 23; and
   developing the object that has been exposed.

* * * * *